(12) United States Patent
Kim et al.

(10) Patent No.: US 12,512,836 B2
(45) Date of Patent: Dec. 30, 2025

(54) ELECTRONIC DEVICE FOR OVERVOLTAGE PROTECTION

(71) Applicant: SAMSUNG ELECTRONICS CO., LTD., Suwon-si (KR)

(72) Inventors: Hyoungjoong Kim, Suwon-si (KR); Cheolmin Ahn, Suwon-si (KR); Myeong-Cheol Kim, Suwon-si (KR); Woongki Min, Suwon-si (KR); Sangho Kim, Suwon-si (KR); Soomin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 183 days.

(21) Appl. No.: 18/349,823

(22) Filed: Jul. 10, 2023

(65) Prior Publication Data

US 2024/0072802 A1 Feb. 29, 2024

(30) Foreign Application Priority Data

Aug. 25, 2022 (KR) .................. 10-2022-0106644
Nov. 9, 2022 (KR) .................. 10-2022-0148439

(51) Int. Cl.
*H03K 19/003* (2006.01)
(52) U.S. Cl.
CPC .............. *H03K 19/00315* (2013.01)
(58) Field of Classification Search
CPC ........ H03K 17/08; H03K 17/081; H03K 17/08104; H03K 17/0814; H03K 17/08142; H03K 19/003; H03K 19/00315; H03K 19/00338
See application file for complete search history.

(56) References Cited

U.S. PATENT DOCUMENTS

| | | | |
|---|---|---|---|
| 6,842,320 B1 | 1/2005 | Mathur et al. | |
| 7,813,093 B2 | 10/2010 | Boyko et al. | |
| 7,936,209 B2 | 5/2011 | Bhattacharya et al. | |
| 9,214,933 B2 | 12/2015 | Chern et al. | |
| 9,495,002 B2 | 11/2016 | Low | |
| 9,729,343 B2 * | 8/2017 | Chan ................. | H04L 12/40045 |
| 11,101,799 B2 | 8/2021 | Lee | |
| 2014/0240036 A1 * | 8/2014 | Kurokawa ........... | H10D 89/819 |
| | | | 327/537 |

(Continued)

FOREIGN PATENT DOCUMENTS

WO 0038322 6/2000

*Primary Examiner* — Jason M Crawford
(74) *Attorney, Agent, or Firm* — MORGAN, LEWIS & BOCKIUS LLP

(57) ABSTRACT

A electronic device includes a transceiver including a transmitter and a receiver that operate based on a power source voltage and a pad voltage applied from a pad; and an overvoltage protection circuit to apply a first protection voltage to the transmitter and a second protection voltage to the receiver. The overvoltage protection circuit includes: a reference voltage generator to generate a reference voltage when the power source voltage is in an on state; and a voltage detector to set the first protection voltage and the second protection voltage based on the reference voltage when the power source voltage is in an on state, and set the first protection voltage and the second protection voltage based on the pad voltage when the power source voltage is in an off state.

14 Claims, 17 Drawing Sheets

(56) References Cited

U.S. PATENT DOCUMENTS

| | | | | |
|---|---|---|---|---|
| 2015/0316977 | A1* | 11/2015 | Low | G06F 1/00 |
| | | | | 713/340 |
| 2021/0066911 | A1* | 3/2021 | Kamimaru | H10D 89/811 |
| 2024/0072802 | A1* | 2/2024 | Kim | H03K 19/00315 |

* cited by examiner

US 12,512,836 B2

ELECTRONIC DEVICE FOR OVERVOLTAGE PROTECTION

CROSS-REFERENCE TO RELATED APPLICATIONS

This U.S. non-provisional patent application claims priority under 35 U.S.C. § 119 to Korean Patent Application No. 10-2022-0106644 filed on Aug. 25, 2022, and No. 10-2022-0148439 filed on Nov. 9, 2022 in the Korean Intellectual Property Office, the disclosures of which are incorporated by reference in their entireties herein.

1. Technical Field

Embodiments of the present disclosure described herein relate to an electronic device for overvoltage protection.

2. Discussion of Related Art

A transceiver is an electronic device capable of transmitting and receiving signals. Radio transceivers are widely used in wireless devices to transmit and receive radio signals. For example, a cellular phone may use a radio transceiver to transmit and receive the two sides of a phone conversation using radio waves to a cell tower and a wireless modem may use a radio transceiver to exchange digital data with a wireless router.

The transceiver may exchange signals with other electronic devices through an input/output pad. A transistor included within the transceiver may be used for signal processing. The transistor has a limit voltage according to its type (e.g., gate thickness). When a relatively high voltage is applied to the input/output pad, a voltage higher than the limit voltage may be applied to the transistor, which may reduce reliability of the transistor and shorten the lifespan of the transceiver.

SUMMARY

Embodiments of the present disclosure provide an electronic device for overvoltage protection.

According to an embodiment, an electronic device includes a transceiver and an overvoltage protection circuit. The transceiver includes a transmitter and a receiver that operate based on a power source voltage and a pad voltage applied from a pad. The overvoltage protection circuit is configured to apply a first protection voltage to the transmitter and a second protection voltage to the receiver. The overvoltage protection circuit includes a reference voltage generator and a voltage detector. The reference voltage generator is configured to generate a reference voltage when the power source voltage is in an on state. The voltage detector is configured set the first protection voltage and the second protection voltage based on the reference voltage when the power source voltage is in the on state, and set the first protection voltage and the second protection voltage based on the pad voltage when the power source voltage is in an off state.

For example, the first protection voltage may be a body voltage applied to a body terminal of a first transistor of the transmitter, and the second protection voltage may be a source voltage applied to a source terminal of a second transistor of the receiver or a drain voltage applied to a drain terminal of the second transistor.

For example, the transmitter may include a first transmission terminal configured to operate according to a low power source voltage that is relatively lower than the power source voltage; and a second transmission terminal including at least one p-channel metal-oxide semiconductor (PMOS) transistor that operates according to the power source voltage and has a source terminal or a drain terminal to which the pad voltage is applied, wherein the receiver includes a first reception terminal including at least one n-channel metal-oxide semiconductor (NMOS) transistor or PMOS transistor that operates according to the power source voltage and has a gate terminal to which the pad voltage is applied; and a second reception terminal configured to operate according to the low power source voltage.

For example, the first protection voltage may be applied to a body terminal of the at least one PMOS transistor, wherein the second protection voltage is applied to a source terminal or a drain terminal of the at least one NMOS transistor or PMOS transistor.

For example, a voltage between nodes of the at least one PMOS transistor and the at least one NMOS transistor may be maintained at the low power source voltage or below.

For example, the first protection voltage may be greater than or equal to the low power source voltage and less than or equal to the power source voltage when the power source voltage is in the off state, and equal to the power source voltage when the power source voltage is in the on state.

For example, the second protection voltage may be equal to or less than a difference between the pad voltage and the low power source voltage when the power source voltage is in the off state, and may not be applied to the at least one NMOS transistor or PMOS transistor when the power source voltage is in the on state.

For example, the reference voltage may include a first reference voltage and a second reference voltage for generating the first protection voltage and a third reference voltage for generating the second protection voltage, wherein the first reference voltage is equal to the power source voltage, the second reference voltage is lower than the low power source voltage, and the third reference voltage is between the power source voltage and the low power source voltage.

For example, the voltage detector may include a first detector configured to generate the first protection voltage and apply the first protection voltage to the transmitter; and a second detector configured to generate the second protection voltage and apply the second protection voltage to the receiver.

For example, the first detector may include a first protection resistor connected to the pad; a (1-1)-th NMOS transistor having a gate terminal connected to the first protection resistor; a (1-1)-th PMOS transistor having a gate terminal to which the second reference voltage is applied and a source terminal connected to the (1-1)-th NMOS transistor; a (1-2)-th PMOS transistor having a gate terminal to which the power source voltage is applied and a source terminal connected to the (1-1)-th PMOS transistor; a (1-3)-th PMOS transistor having a gate terminal to which the second reference voltage is applied and a source terminal connected to the (1-2)-th PMOS transistor; a (1-2)-th NMOS transistor having a gate terminal connected to the (1-3)-th PMOS transistor; a (1-3)-th NMOS transistor having a gate terminal connected to the (1-2)-th NMOS transistor; and a (1-4)-th NMOS transistor having a gate terminal to which the power source voltage is applied and a source terminal connected to the transmitter, wherein body terminals of the (1-1)-th PMOS transistor, the (1-2)-th PMOS transistor and the (1-3)-th PMOS transistor are connected to the transmitter, and a voltage level of the first protection voltage is adjusted according to the number of stacks of the (1-1)-th NMOS transistor to the (1-3)-th NMOS transistor.

For example, when the power source voltage is in the off state, the (1-4)-th NMOS transistor may be turned off, and a voltage divided from the pad voltage may be applied to the transmitter as the first protection voltage, and when the power source voltage is in the on state, the (1-4)-th NMOS transistor may be turned on, and a voltage corresponding to the first reference voltage may be applied to the transmitter as the first protection voltage.

For example, the second detector may include a second protection resistor connected to the pad; a (2-1)-th NMOS transistor having a gate terminal connected to the second protection resistor; a (2-2)-th NMOS transistor having a gate terminal connected to the (2-1)-th NMOS transistor; a (2-1)-th PMOS transistor having a gate to which the third reference voltage is applied and a source terminal connected to the (2-2)-th NMOS transistor; a (2-2)-th PMOS transistor having a gate to which the third reference voltage is applied and a source terminal connected to the (2-1)-th PMOS transistor; a (2-3)-th NMOS transistor having a gate terminal connected to the (2-2)-th PMOS transistor; and a (2-4)-th NMOS transistor having a gate terminal to which the power source voltage is applied and a source terminal to which the third reference voltage is applied, wherein a body terminal of the (2-1)-th PMOS transistor and the source terminal of the (2-2)-th PMOS transistor are connected to the receiver.

For example, when the power source voltage is in the off state, the (2-4)-th NMOS transistor may be turned off, and a voltage divided from the pad voltage may be applied to the receiver as the second protection voltage, and when the power source voltage is in the on state, the (2-4)-th NMOS transistor may be turned on, and the body terminal of the (2-1)-th PMOS transistor and the source terminal of the (2-2)-th PMOS transistor may have a high impedance.

For example, a voltage level of the second protection voltage may be adjusted according to the number of stacks of the (2-1)-th NMOS transistor to the (2-3)-th NMOS transistor.

According to an embodiment, an overvoltage protection circuit is provided for applying a protection voltage to a receiver operating based on a power source voltage and a pad voltage applied from a pad. The overvoltage protection circuit includes a reference voltage generator and a voltage detector. The reference voltage generator is configured to generate a reference voltage when the power source voltage is in an on state. The voltage detector is configured to generate and apply the protection voltage to the receive based on the reference voltage when the power source voltage is in the on state, and generate and apply the protection voltage to the receiver based on the pad voltage when the power source voltage is in an off state.

For example, the voltage detector may include a protection resistor connected to the pad; a first NMOS transistor having a gate terminal connected to the protection resistor; a second NMOS transistor having a gate terminal connected to the first NMOS transistor; a first PMOS transistor having a gate terminal to which the reference voltage is applied and a source terminal connected to the second NMOS transistor; a second PMOS transistor having a gate terminal to which the reference voltage is applied and a source terminal connected to the first PMOS transistor; a third NMOS transistor having a gate terminal connected to the second PMOS transistor; and a fourth NMOS transistor having a gate terminal to which the power source voltage is applied and a source terminal to which the reference voltage is applied, wherein a body terminal of the first PMOS transistor and the source terminal of the second PMOS transistor are connected to the receiver.

For example, a voltage level of the protection voltage may be adjusted according to the number of stacks of the first NMOS transistor to the third NMOS transistor.

For example, when the power source voltage is in the off state, the fourth NMOS transistor may be turned off, and a voltage divided from the pad voltage may be applied to the receiver as the protection voltage, and when the power source voltage is in the on state, the fourth NMOS transistor may be turned on, and the body terminal of the first PMOS transistor and the source terminal of the second PMOS transistor may have a high impedance.

For example, the protection voltage may be equal to or less than a difference value between the pad voltage and a limit voltage of the receiver when the power source voltage is in the off state.

According to an embodiment, an electronic device includes a receiver and an overvoltage protection circuit. The receiver is configured to operate based on a power source voltage and a pad voltage applied from a pad. The receiver includes at least one transistor to which the pad voltage is applied. The overvoltage protection circuit is configured to apply a protection voltage to the receiver. The overvoltage protection circuit includes a reference voltage generator and a voltage detector. The reference voltage generator is configured to generate a reference voltage when the power source voltage is in an on state. The voltage detector is configured to generate and apply the protection voltage to the receiver based on the pad voltage when the power source voltage is in the on state, and generate and apply the protection voltage to the receiver based on the pad voltage when the power source voltage is in an off state.

According to at least one embodiment of the present disclosure, there may be provided an electronic device for overvoltage protection.

According to at least one embodiment of the present disclosure, both transistors included in a transmitter and a receiver may be protected by separately applying protection voltages to each of the transmitter and receiver to prevent an overvoltage.

In addition, the transceiver may be protected regardless of the state of the power source voltage by applying the protection voltage by considering the on state and the off state of the power source voltage.

In addition, thin gate-based transistors may also be protected by preventing the voltage between the nodes of a transistor of the transceiver from exceeding a limit voltage.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described clearly and in detail so that those skilled in the art can easily carry out embodiments of the present disclosure.

Figure 1:
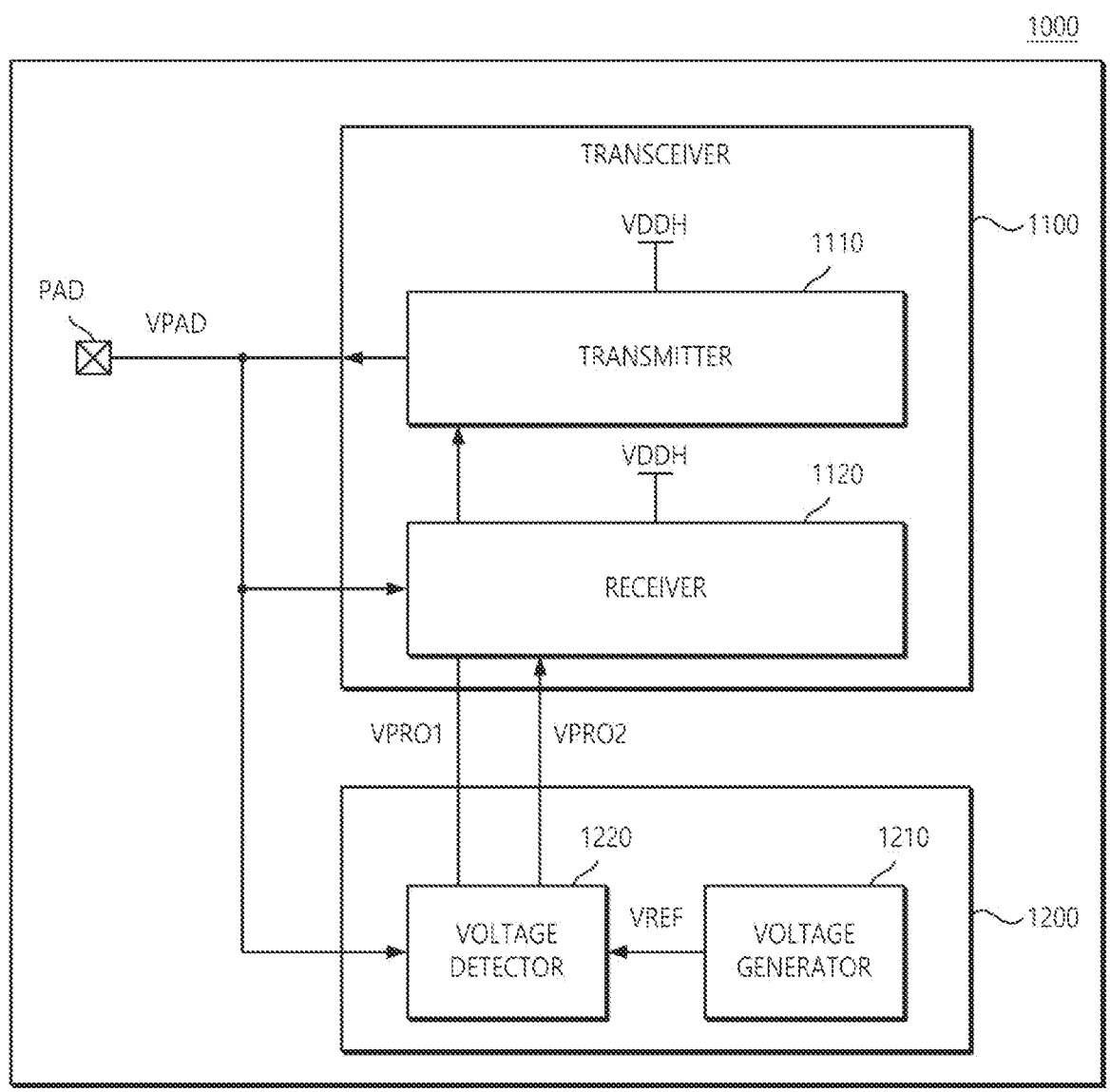
FIG. 1 is a block diagram illustrating an electronic device according to an embodiment of the present disclosure.

FIG. 1 is a block diagram illustrating an electronic device 1000 according to an embodiment of the present disclosure.

Referring to FIG. 1, the electronic device 1000 according to an embodiment includes a transceiver 1100 (e.g., a transceiver circuit) and an overvoltage protection circuit 1200.

The transceiver 1100 includes a transmitter 1110 (e.g., a transmitter circuit) and a receiver 1120 (e.g., a receiver circuit). Each of the transmitter 1110 and the receiver 1120 operates based on a power source voltage VDDH and a pad voltage VPAD applied from a pad PAD. For example, the pad PAD may be a small conductive surface area of a printed circuit board. Each of the transmitter 1110 and the receiver 1120 operates based on at least one transistor to which the pad voltage VPAD is applied.

In an embodiment of the present disclosure, the power source voltage VDDH, which is a driving voltage for driving the transmitter 1110, the receiver 1120, and the transceiver 1100, includes a low power source voltage VDDL having a relatively low level and a high power source voltage VDDH having a relatively high level. For example, the magnitude of the low power source voltage VDDL may be lower than the magnitude of the high power source voltage VDDH. However, hereinafter, in the present disclosure, for convenience, the high power source voltage VDDH will be commonly referred to as the power source voltage VDDH, and unless otherwise specified, the power source voltage VDDH may be understood as the high power source voltage VDDH.

The low power source voltage VDDL may also be referred to as a core power source voltage. The low power source voltage VDDL may be a voltage for driving low stages of the transmitter 1110 and the receiver 1120, and the high power source voltage VDDH, which is a voltage shifted from a level of a separate power source voltage or the low power source voltage VDDL to a high voltage, may be a voltage for driving a high stage of the transmitter 1110 and the receiver 1120. For example, a low stage may be a stage that operates based on a low power source voltage VDDL and a high stage may be a stage that operates based on a high power source voltage VDDH.

In an embodiment, the pad voltage VPAD is a voltage applied to the pad PAD provided for an input/output interface between the transceiver 1100 and other electronic devices.

Each of the low power source voltage VDDL, the power source voltage VDDH and the pad voltage VPAD described above may have a value within a predetermined voltage range. For example, the pad voltage VPAD may have a level equal to or similar to that of the power source voltage VDDH, which is higher than the low power source voltage VDDL. In this case, when the pad voltage VPAD is applied to a transistor included in the transceiver 1100, the voltage difference between terminal nodes, that is, between terminals of the transistor may exceed the limit voltage of the transistor, so that reliability issues may arise.

The overvoltage protection circuit 1200 may be connected to the transceiver 1100 to prevent the above-described high voltage from being applied to the transceiver 1100. The overvoltage protection circuit 1200 applies a first protection voltage VPRO1 to the transmitter 1110 and a second protection voltage VPRO2 to the receiver 1120. In detail, the overvoltage protection circuit 1200 may apply the first protection voltage VPRO1 to at least one transistor connected to the pad PAD in the transmitter 1110 and the second protection voltage VPRO2 to at least one transistor connected to the pad PAD in the receiver 1120. According to an embodiment, the first protection voltage VPRO1 is applied to a body terminal of the transistor included in the transmitter 1110, and the second protection voltage VPRO2 is applied to a source terminal or a drain terminal of at least one transistor included in the receiver 1120. The body terminal may also be referred to as a base, bulk, or substrate terminal and differs from a gate terminal. The first protection voltage VPRO1 and the second protection voltage VPRO2 may maintain the voltage between the nodes of the transistor of the transmitter 1110 or the receiver 1120 at the low power source voltage VDDL or below.

The overvoltage protection circuit 1200 includes a reference voltage generator 1210 and a voltage detector 1220 (e.g., a voltage detector circuit) to generate and apply a protection voltage according to the on/off of the power source voltage VDDH. For example, the overvoltage protection circuit 1200 may apply the protection voltage based on whether the power source voltage VDDH is applied or not applied to the transmitter 1110 and the receiver 1120.

The reference voltage generator 1210 generates a reference voltage VREF for generating a protection voltage when the power source voltage VDDH is in an on state or is applied. According to an embodiment, the reference voltage VREF includes a first reference voltage and a second reference voltage for generating the first protection voltage VPRO1 and a third reference voltage for generating the second protection voltage VPRO2. The reference voltage generator 1210 generates and transmits the reference voltage VREF to the voltage detector 1220 when the power source voltage VDDH is in an on state or is applied. However, when the power source voltage VDDH is in an off state or is not applied, the reference voltage generator 1210 does not generate the reference voltage VREF, which may be understood as the reference voltage VREF being 0 (zero) V. In an embodiment, the power source voltage VDDH being in an on state means that a voltage of the power source voltage VDDH is within a certain voltage range and the power source voltage VDDH being in the off state means that a voltage of the power source voltage VDDH is lower than the certain voltage range or is 0 V.

Through the reference voltage generator 1210, when the power source voltage VDDH is in an on state, the constant reference voltage VREF may be always provided.

The voltage detector 1220 generates a protection voltage according to on/off of the power source voltage VDDH. In an embodiment, the voltage detector 1220 generates and applies the first protection voltage VPRO1 and the second protection voltage VPRO2 based on the reference voltage VREF when the power source voltage VDDH is in an on state, and generates and applies the first protection voltage VPRO1 and the second protection voltage VPRO2 based on the pad voltage VPAD when the power source voltage VDDH is in an off state. That is, the voltage detector 1220 may generate a protection voltage to protect the transceiver 1100 from a high voltage corresponding to each on/off state of the power source voltage VDDH. For example, the voltage detector 1220 may set the first protection voltage VPRO1 and the second protection voltage VPRO2 based on the reference voltage VREF when the power source voltage VDDH is in an on state and set the first protection voltage VPRO1 and the second protection voltage VPRO2 based on the pad voltage VPAD when the power source voltage VDDH is in an off state.

Each of the first protection voltage VPRO1 and the second protection voltage VPRO2 may have individual and different values depending on the on state and off state of the power source voltage VDDH to appropriately protect the transceiver 1100 according to the state of the power source voltage VDDH. This is because, when the power source voltage VDDH is in an on state, the power source voltage VDDH is also applied to the transistor connected to the pad PAD, so the voltages between nodes may be different when the power source voltage VDDH is in an on state and off state.

According to an embodiment, the first protection voltage VPRO1 is greater than or equal to the low power source voltage VDDL and less than or equal to the power source voltage VDDH when the power source voltage VDDH is in an off state, and when the power source voltage VDDH is in an on state, is equal to or equivalent to the power source voltage VDDH. According to an embodiment, the second protection voltage VPRO2 is equal to or less than a difference between the pad voltage VPAD and the low power source voltage VDDL when the power source voltage VDDH is in an off state, and when the power source voltage VDDH is in an on state, the second protection voltage VPRO2 is not applied to the receiver 1120. More detailed operations of the protection voltages VPRO1 and VPRO2 and the voltage detector 1220 will be described later.

The above-described electronic device 1000 according to the present disclosure may prevent a voltage between nodes of the transistors from exceeding a limit voltage even when the pad voltage VPAD of a high voltage is applied to the transistors included in the transmitter 1110 and the receiver 1120, through the overvoltage protection circuit 1200 which applies the protection voltage to the transmitter 1110 and the receiver 1120. In particular, the present embodiment may protect all the transistors included in the transmitter 1110 and the receiver 1120 by individually or separately applying protection voltages to the transmitter 1110 and the receiver 1120. In addition, the transceiver 1100 may be protected regardless of the state of the power source voltage VDDH by applying the protection voltage considering both the on/off states of the power source voltage VDDH. Accordingly, it is possible to guarantee reliability of the transistors included in the transceiver 1100.

Hereinafter, various embodiments of the electronic device 1000 in the present disclosure described above will be explained.

According to various embodiments, the transmitter 1110 and the receiver 1120 protected by the overvoltage protection circuit 1200 may include all the transmitter 1110 and the receiver 1120 which are connected to the pad PAD and to which the pad voltage VPAD is applied.

For example, the transmitter 1110 and the receiver 1120 may include a low stage and a high stage.

Figure 2:
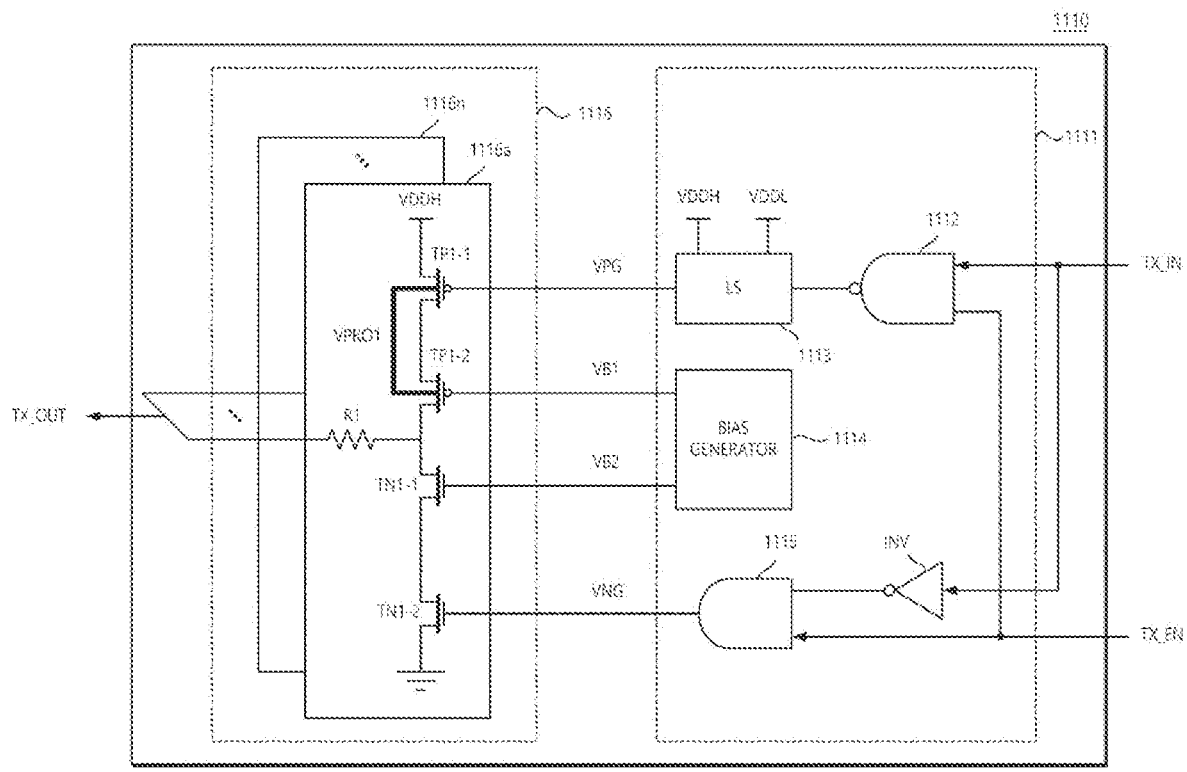
FIG. 2 is a circuit diagram illustrating a transmitter according to an embodiment of the present disclosure.

FIG. 2 is a circuit diagram illustrating a transmitter according to an embodiment of the present disclosure.

Referring to FIG. 2, the transmitter 1110 according to an embodiment includes a first transmission terminal 1111 and a second transmission terminal 1116. The first transmission terminal 1111 receives and amplifies a transmission input signal TX_IN, and applies the amplified signal to the second transmission terminal 1116. The second transmission terminal 1116 amplifies the transmission input signal TX_IN received from the first transmission terminal 1111 to generate a transmission output signal TX_OUT.

According to an embodiment, the first transmission terminal 1111 may include a NAND gate 1112, a level shifter 1113 (e.g., a level shifting circuit), a bias generator 1114 (e.g., a bias generation circuit), an inverter INV (e.g., an inverter gate or circuit), and an AND gate 1115. The NAND gate 1112 and the AND gate 1115 operate according to logic states of the transmission input signal TX_IN and a transmission enable signal TX_EN. An output of the NAND gate 1112 is shifted by the level shifter 1113 to generate a voltage VPG that is applied to the second transmission terminal 1116, and an output VNG of the AND gate 1115 is directly shifted to the second transmission terminal 1116 without additional shifting. In this case, the voltage VPG may have a range between the value obtained by subtracting the low power source voltage VDDL from the power source voltage VDDH and the power source voltage VDDH, and the output VNG of the AND gate 1115 may have a range between 0 (zero) volts and the low power source voltage VDDL. The bias generator 1114 generates a first bias voltage VB1 and a second bias voltage VB2 for driving the second transmission terminal 1116 and applies them to the second transmission terminal 1116. In this case, the first bias voltage VB1 and the second bias voltage VB2 may have appropriate values such that the voltages between nodes of the transistors included in the second transmission terminal 1116 do not exceed a limit voltage.

The second transmission terminal 1116 operates based on the signals transmitted from the first transmission terminal 1111. The second transmission terminal 1116 may include a plurality of amplification stages 1116a to 1116n (e.g., amplification circuits). Each of the plurality of amplification stages 1116a to 1116n includes a (1-1)-th PMOS transistor TP1-1, a (1-2)-th PMOS transistor TP1-2, a (1-1)-th NMOS transistor TN1-1, and a (1-2)-th NMOS transistor TN1-2, and an output resistor R1. The (1-1)-th PMOS transistor TP1-1, the (1-2)-th PMOS transistor TP1-2, the (1-1)-th NMOS transistor TN1-1, and the (1-2)-th NMOS transistor TN1-2 may be connected in cascade. The output VPG of the level shifter 1113 is applied to the gate terminal of the (1-1)-th PMOS transistor TP1-1, and the first bias voltage VB1 is applied to the gate terminal of the (1-2)-th PMOS transistor TP1-2. In addition, the second bias voltage VB2 is applied to the gate terminal of the (1-1)-th NMOS transistor TN1-1, and the output VNG of the AND gate 1115 is applied to the gate terminal of the (1-2)-th NMOS transistor TN1-2. The (1-1)-th PMOS transistor TP1-1, the (1-2)-th PMOS transistor TP1-2, the (1-1)-th NMOS transistor TN1-1 and the (1-2)-th NMOS transistor TN1-2 are turned on according to their respective gate voltages, amplify the power source voltage VDDH to generate the transmission output signal TX_OUT, and transmit the transmission output signal TX_OUT through the output resistor R1.

Because the pad PAD is connected to the output resistor R1 through which the transmission output signal TX_OUT is output, the high pad voltage VPAD may be applied to the drain terminals of the (1-1)-th PMOS transistor TP1-1 and the (1-2)-th PMOS transistor TP1-2. Accordingly, the first protection voltage VPRO1 may be applied to prevent high voltages of the (1-1)-th PMOS transistor TP1-1 and the (1-2)-th PMOS transistor TP1-2. For example, the first protection voltage VPRO1 may be applied to body terminals of the (1-1)-th PMOS transistor TP1-1 and the (1-2)-th PMOS transistor TP1-2.

The transmitter 1110 of FIG. 2 is an exemplary embodiment, and the overvoltage protection circuit 1200 of the present disclosure is not limited thereto.

Figure 3:
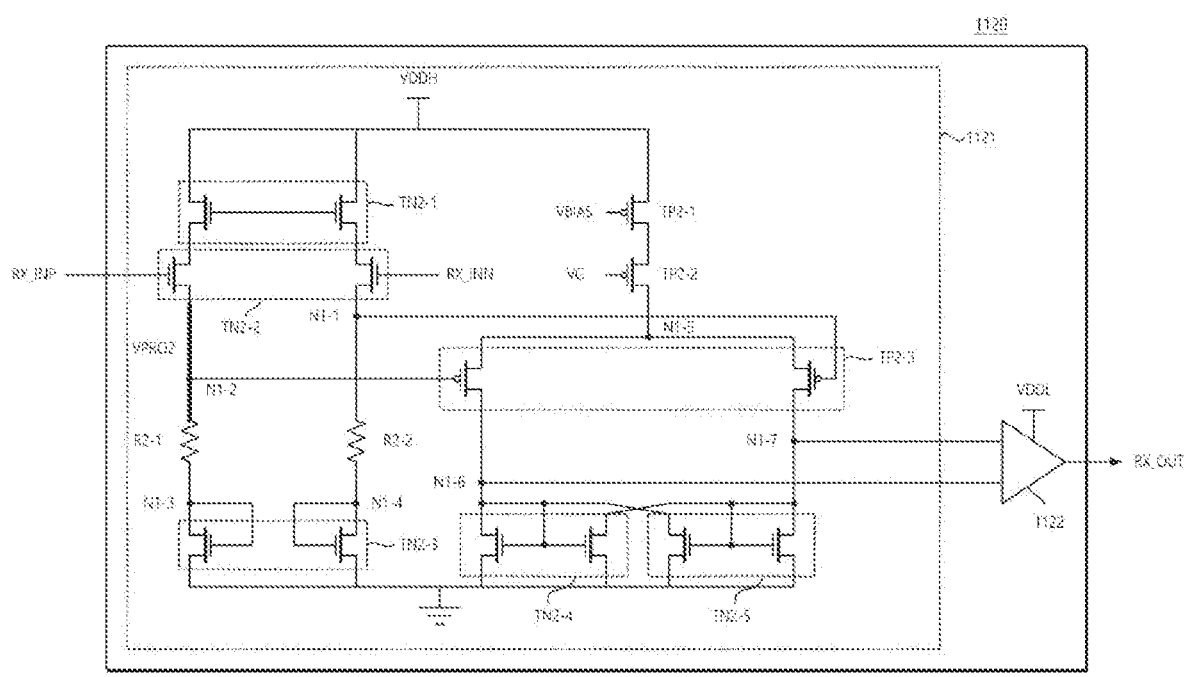
FIG. 3 is a circuit diagram of a receiver according to an embodiment of the present disclosure.

FIG. 3 is a circuit diagram of a receiver according to an embodiment of the present disclosure.

Referring to FIG. 3, the receiver 1120 according to an embodiment includes a first reception terminal 1121 and a second reception terminal 1122. In an embodiment, the second reception terminal 1122 is an operational amplifier. The first reception terminal 1121 receives an input signal, lowers a signal level of the input signal to generate lowered signal, and applies the lowered signal to the second reception terminal 1122. The second reception terminal 1122 converts the input signal, which is received from the first reception terminal 1121, from a differential signal to a single-ended signal. The differential signal may include a signal RX_INP and a second RX_INN that is an inverse of signal RX_INP.

The first reception terminal 1121 includes a (2-1)-th NMOS transistor pair TN2-1, a (2-2)-th NMOS transistor pair TN2-2, a (2-1)-th resistor R2-1 and a (2-2)-th resistor R2-2, a (2-3)-th NMOS transistor pair TN2-3, a (2-1)-th PMOS transistor TP2-1, a (2-2)-th PMOS transistor TP2-2, a (2-3)-th PMOS transistor pair TP2-3, a (2-4)-th NMOS transistor pair TN2-4, and a (2-5)-th NMOS transistor pair TN2-5. In this case, the (2-1)-th NMOS transistor pair TN2-1, the (2-2)-th NMOS transistor pair TN2-2, the (2-1)-th resistor R2-1 and the (2-2)-th resistor R2-2, and the (2-3)-th NMOS transistor pair TN2-3 may have a source-follower structure as shown, and the (2-4)-th NMOS transistor pair TN2-4 and the (2-5)-th NMOS transistor pair TN2-5 may have a cross-coupled structure having active feedback.

The power source voltage VDDH is applied to one terminal of the (2-1)-th NMOS pair transistor TN2-1, and the (2-2)-th NMOS transistor pair TN2-2 is connected to another terminal of the (2-1)-th NMOS pair TN2-1. A differential reception input signal or a single-ended reception input signal and reference voltages RX_INP and RX_INN may be applied to each gate terminal of the (2-2)-th NMOS transistor pair TN2-2. A (1-1)-th node N1-1 and a (1-2)-th node N1-2 are respectively connected to one end of the (2-2)-th NMOS transistor pair TN2-2. One terminals of the (2-1)-th resistor R2-1 and the (2-2)-th resistor R2-2 are connected to the (1-1)-th node N1-1 and the (1-2)-th node N1-2, and a (1-3)-th node N1-3 and a (1-4)-th node N1-4 are connected to the other ends of the (2-1)-th resistor R2-1 and the (2-2)-th resistor R2-2. The (2-3)-th NMOS transistor pair TN2-3 is connected to the (1-3)-th node N1-3 and the (1-4)-th node N1-4.

The power source voltage VDDH is applied to the (2-1)-th PMOS TP2-1 and the (2-2)-th PMOS TP2-2, and a bias voltage VBIAS for driving and a gate voltage VG for driving are applied to each gate.

Each gate terminal of the (2-3)-th PMOS transistor pair TP2-3 is connected to the node N1-1 and the (1-2)-th node N1-2. One terminal of the (2-3)-th PMOS transistor pair TP2-3 is connected to the (2-2)-th PMOS TP2-2 through a (1-5)-th node N1-5, and the other terminal is connected to a (1-6)-th node N1-6 and a (1-7)-th node N1-7. The (2-3)-th PMOS transistor pair TP2-3 may perform an amplification operation.

The (2-4)-th NMOS TN2-4 and the (2-5)-th NMOS TN2-5 are connected to the (1-6)-th node N1-6 and the (1-7)-th node N1-7 while having a cross-coupled structure and provide an active load to create hysteresis characteristics.

The second reception terminal 1122 is connected to the (1-6)-th node N1-6 and the (1-7)-th node N1-7. The second reception terminal 1122 operates according to the low power source voltage VDDL and converts a differential signal into a single-ended signal being the output signal.

Because the pad PAD is connected to the (2-2)-th NMOS transistor pair TN2-2 to which the received input signal RX_IN is applied, the high pad voltage VPAD may be applied to the gate terminal. Accordingly, the second protection voltage VPRO2 may be applied to one terminal (the (1-2)-th node N1-2) of the (2-2)-th NMOS transistor pair TN2-2 to prevent a high voltage. For example, the second protection voltage VPRO2 may be applied to source terminal or a drain terminal of the transistor having a gate terminal receiving RX_INP.

The receiver 1120 of FIG. 3 is an exemplary embodiment, and the overvoltage protection circuit 1200 according to the embodiment of the present disclosure is not limited thereto.

The overvoltage protection circuit 1200 may generate a protection voltage for protecting the transmitter 1110 and the receiver 1120 according to the above-described embodiments based on the reference voltage VREF.

Figure 4:
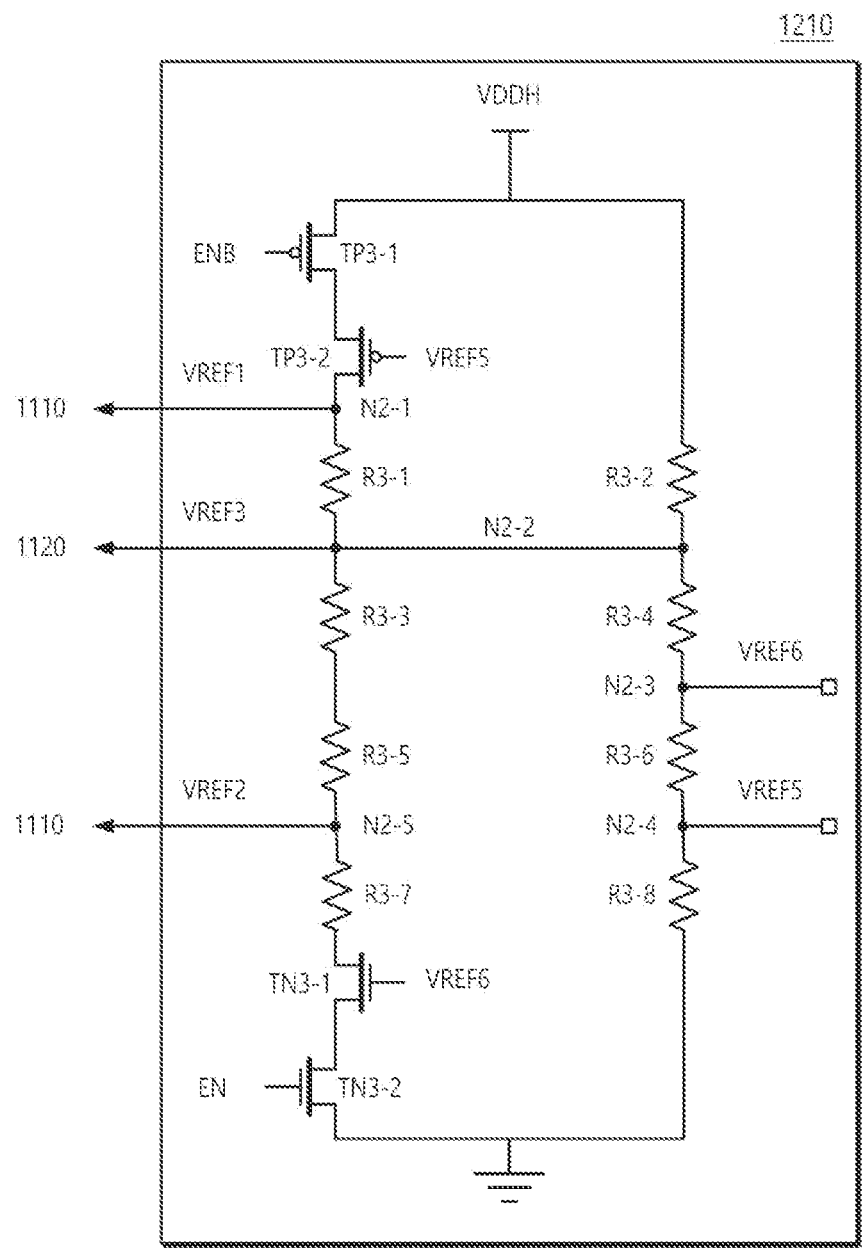
FIG. 4 is a circuit diagram illustrating a reference voltage generator according to an embodiment of the present disclosure.

FIG. 4 is a circuit diagram illustrating a reference voltage generator according to an embodiment of the present disclosure.

Referring to FIG. 4, the reference voltage generator 1210 according to an embodiment includes a (3-1)-th PMOS transistor TP3-1, a (3-2)-th PMOS transistor TP3-2, a (3-1)-th resistor R3-1 to a (3-8)-th resistors R3-8, a (3-1)-th NMOS transistor TN3-1, and a (3-2)-th NMOS transistor TN3-2.

The (3-1)-th PMOS transistor TP3-1 and the (3-2)-th PMOS transistor TP3-2 are connected in a cascode structure, and the power source voltage VDDH is applied. The (3-2)-th PMOS transistor (TP3-2) is connected to the (3-1)-th resistor R3-1 through a (2-1)-th node (N2-1), the (3-1)-th resistor R3-1 is connected to the (3-3)-th resistor (R3-3) and the (3-5)-th resistor R3-5 through a (2-2)-th node N2-2, and the (3-5)-th resistor R3-5 is connected to the (3-7)-th resistor R3-7 through a (2-5)-th node N2-5. The (3-1)-th NMOS transistor TN3-1 and the (3-2)-th NMOS transistor TN3-2 are connected to the (3-7)-th resistor R3-7 in a cascode structure.

The (3-2)-th resistor R3-2 to which the power source voltage VDDH is applied is connected to the (3-4)-th resistor R3-4 through the (2-2)-th node N2-2. The (3-4)-th resistor R3-4 is connected to the (3-6)-th resistor R3-6 through a (2-3)-th node N2-3, and the (3-6)-th resistor R3-6 is the (3-8)-th resistor R3-8 through a (2-4)-th node N2-4.

The (2-3)-th node N2-3 and the (2-4)-th node N2-4 have a sixth reference voltage VREF6 and a fifth reference voltage VREF5 into which the power source voltage VDDH is divided, respectively. The fifth reference voltage VREF5 is applied to the gate terminal of the (3-2)-th PMOS TP3-2, and the sixth reference voltage VREF6 is applied to the gate terminal of the (3-1)-th NMOS TN3-1. The fifth reference voltage VREF5 and the sixth reference voltage VREF5 may have appropriate values such that the voltage between the nodes of the transistor to which the fifth reference voltage VREF5 and the sixth reference voltage VREF6 are applied is equal to or less than the limit voltage.

In an embodiment, the (3-1)-th PMOS transistor TP3-1 and the (3-2)-th NMOS transistor TN3-2 are turned on/off according to complementary enable signals EN and ENB to operate only when the power source voltage VDDH is in an on state.

The power source voltage VDDH is divided through resistors, so that the divided voltage of the (2-1)-th node N2-1 is output as a first reference voltage VREF1, the divided voltage of the (2-2)-th node N2-2 is output as a third reference voltage VREF3, and the divided voltage of the (2-5)-th node N2-5 is output as a second reference voltage VREF2.

In addition to the circuit diagram shown in FIG. 4, the reference voltage generator 1210 according to the present disclosure may have various structures that generate the first to third reference voltages VREF1 to VREF3 based on the power source voltage VDDH only when the power source voltage VDDH is turned on.

According to an embodiment, the first reference voltage VREF1 generated by the reference voltage generator 1210 is equal to the power source voltage VDDH, and the second reference voltage VREF2 is lower than the low power source voltage VDDL, and the third reference voltage VREF3 is between the power source voltage VDDH and the low power source voltage VDDL. Accordingly, the first protection voltage VPRO1 and the second protection voltage VPRO2 generated based on the reference voltage VREF may have values such that the voltages between the nodes of the transistor to which the first protection voltage VPRO1 and the second protection voltage VPRO2 are applied is equal to or less than the limit voltage.

The generated reference voltages VREF (e.g., VREF1-VREF6) are applied to the voltage detector 1220. According to an embodiment, the voltage detector 1220 may include a first detector that is a voltage detector for a transmitter and a second detector that is a voltage detector for a receiver. The first detector generates and applies the first protection voltage VPRO1 to the transmitter 1110, and the second detector generates and applies the second protection voltage VPRO2 to the receiver 1120.

Figure 5:
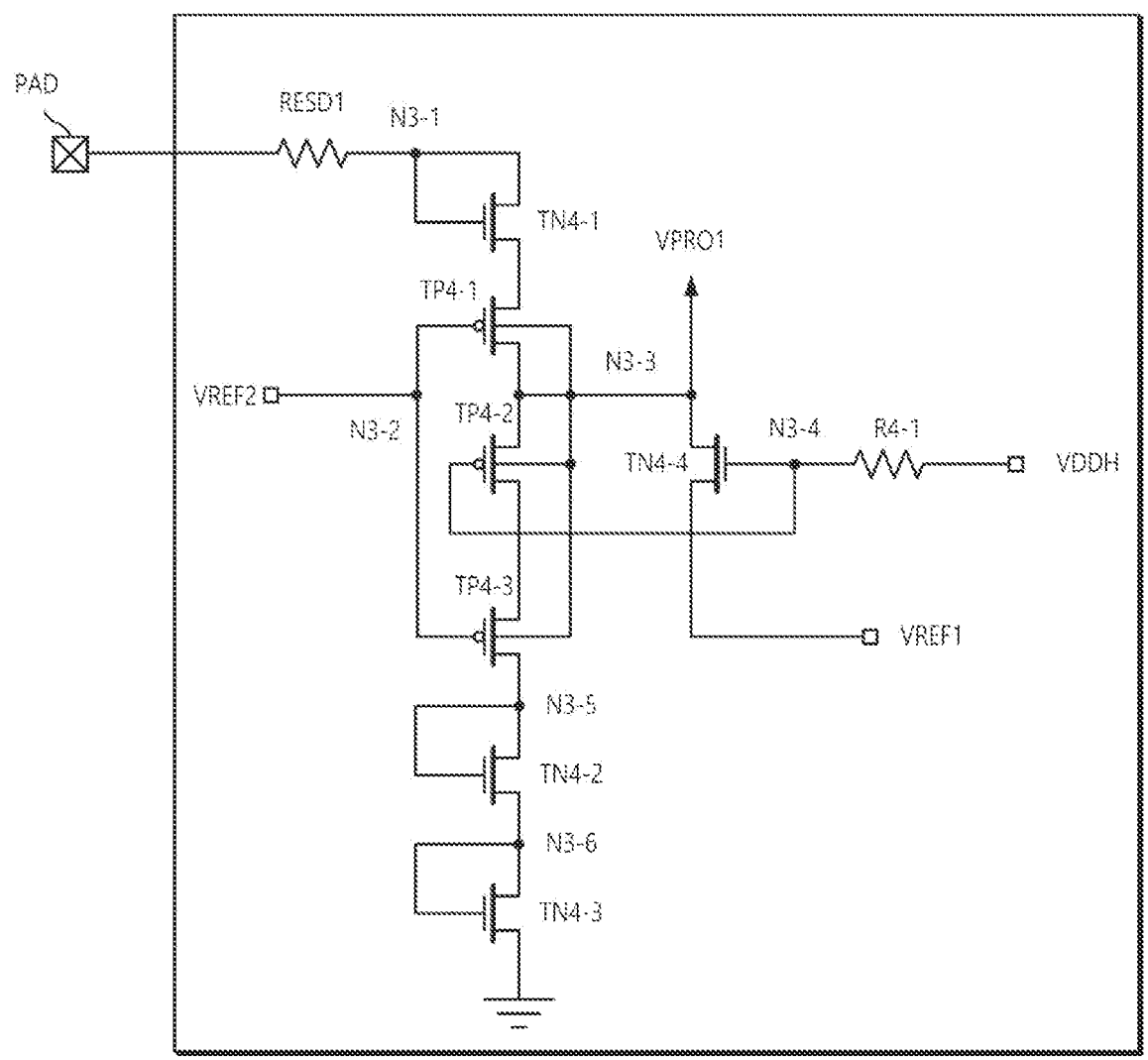
FIG. 5 is a circuit diagram illustrating a first detector according to an embodiment of the present disclosure.

FIG. 5 is a circuit diagram illustrating the first detector according to an embodiment of the present disclosure.

Referring to FIG. 5, a first detector 1221 according to an embodiment includes a first protection resistor RESD1, a (4-1)-th NMOS transistor TN4-1, and a (4-1)-th PMOS transistor TP4-1, a (4-2)-th PMOS transistor TP4-2, a (4-3)-th PMOS transistor TP4-3, a (4-2)-th NMOS transistor TN4-2, a (4-3)-th NMOS transistor TN4-3, a (4-4)-th NMOS transistor TN4-4, and a (4-1)-th resistor R4-1.

The first protection resistor RESD1 is connected to the pad PAD, to which the pad voltage VPAD is applied, and connected to the (4-1)-th NMOS transistor TN4-1 through a (3-1)-th node N3-1.

The gate terminal of the (4-1)-th NMOS transistor TN4-1 is connected to the first protection resistor RESD1. The second reference voltage VREF2 is applied to the gate terminal of the (4-1)-th PMOS transistor TP4-1 through a (3-2)-th node N3-2, and the source terminal of the (4-1)-th PMOS transistor TP4-1 is connected to the (4-1)-th NMOS transistor TN4-1. The power source voltage VDDH is applied to the gate terminal of the (4-2)-th PMOS transistor TP4-2, and the source terminal of the (4-2)-th PMOS transistor TP4-2 is connected to the (4-1)-th PMOS transistor TP4-1. The second reference voltage VREF2 is applied to the gate terminal of the (4-3)-th PMOS transistor TP4-3 through a (3-2)-th node N3-2, and the source terminal of the (4-3)-th PMOS transistor TP4-3 is connected to the (4-2)-th PMOS transistor TP4-2. The gate terminal of the (4-2)-th NMOS transistor TN4-2 is connected to the (4-3)-th PMOS transistor TP4-3. The gate terminal of the (4-3)-th NMOS transistor TN4-3 is connected to the (4-2)-th NMOS transistor TN4-2. The power source voltage VDDH is applied to the gate terminal of the (4-4)-th NMOS transistor TN4-4, and the source terminal of the (4-4)-th NMOS transistor TN4-4 is connected to the transmitter 1110. In this case, the body terminals of the (4-1)-th PMOS transistor TP4-1, the (4-2)-th PMOS transistor TP4-2 and the (4-3)-th PMOS transistor TP4-3 are connected to the transmitter 1110.

More specifically, the second reference voltage VREF2 is applied to the gate terminal of the (4-1)-th PMOS transistor TP4-1, one terminal is connected to the (4-1)-th NMOS transistor TN4-1, and another terminal is connected to the (4-2)-th PMOS transistor TP4-2. A (3-3)-th node N3-3 is connected to the body of the (4-2)-th PMOS transistor TP4-2, a (3-4)-th node N3-4 is connected to the gate terminal of the (4-2)-th PMOS transistor TP4-2, and the (4-3)-th PMOS transistor TP4-3 is connected to another terminal. The (4-2)-th NMOS transistor TN4-2 is connected to an opposite end of the (4-3)-th PMOS transistor TP4-3 through a (3-5)-th node N3-5, and the (4-3)-th NMOS transistor TN4-3 is connected to another terminal of the (4-2)-th NMOS transistor TN4-2 through the (3-6)-th node N3-6.

The power source voltage VDDH is applied to the gate terminal of the (4-4)-th NMOS transistor TN4-4 through the (4-1)-th resistor R4-1 connected through the (3-4)-th node N3-4, one terminal of the (4-4)-th NMOS transistor TN4-4 is connected to the (3-3)-th node N3-3 through which the first protection voltage VPRO1 is output, and the first reference voltage VREF1 is applied to another terminal of the (4-4)-th NMOS transistor TN4-4.

Based on the turn on/off of at least one of the plurality of transistors included in the above-described first detector 1221, the first protection voltage VPRO1 is generated and applied through the (3-3)-th node N3-3.

FIGS. 6A to 6D are circuit diagrams illustrating the operation of the first voltage detector of FIG. 5.

Case in which Power Source Voltage is in Off State

Figure 6A:
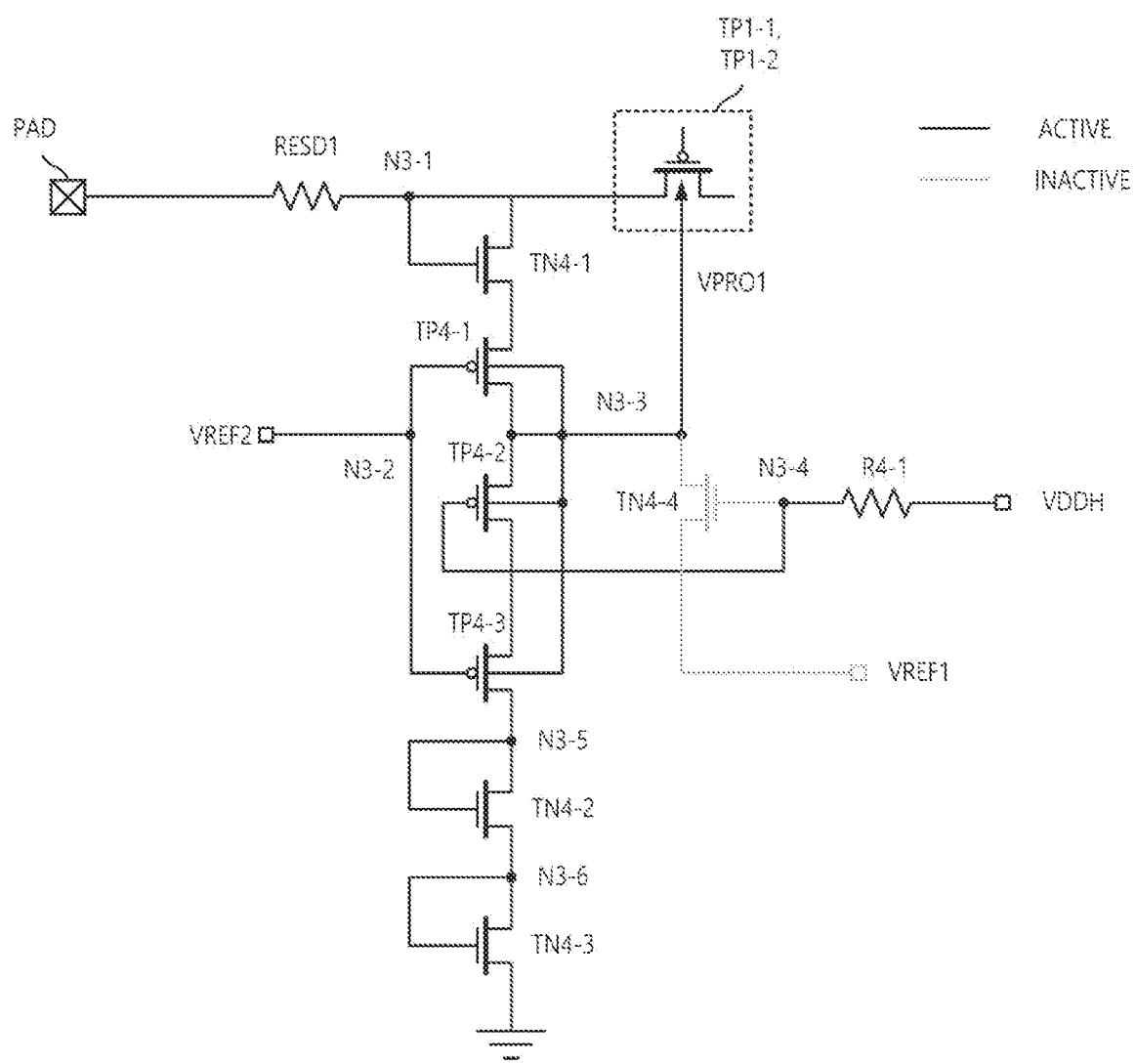
FIGS. 6A to 6D are circuit diagrams illustrating the operation of the first voltage detector of FIG. 5.

Referring to FIG. 6A, when the power source voltage VDDH is in an off state, the voltage of 0 V is applied to the gate terminal of the (4-4)-th NMOS transistor TN4-4, and thus the (4-4)-th NMOS transistor TN4-4 is turned off. In addition, when the power source voltage VDDH is in an off state, as described above, the first reference voltage VREF1 and the second reference voltage VREF2 are also voltages of 0 (zero) V. Accordingly, the (4-1)-th PMOS transistor TP4-1 to the (4-3)-th PMOS transistor TP4-3 are turned on. In addition, when the pad voltage VPAD is applied, the (4-1)-th NMOS transistor TN4-1 to the (4-3)-th NMOS transistor TN4-3 are turned on.

As the transistor is turned on/off, the first protection voltage VPRO1 is generated and applied to the transistor (e.g., the (1-1)-th PMOS transistor TP1-1 and the (1-2)-th PMOS transistor TP1-2) to which the pad voltage VPAD is applied and which is included in the transmitter 1110.

Figure 6B:
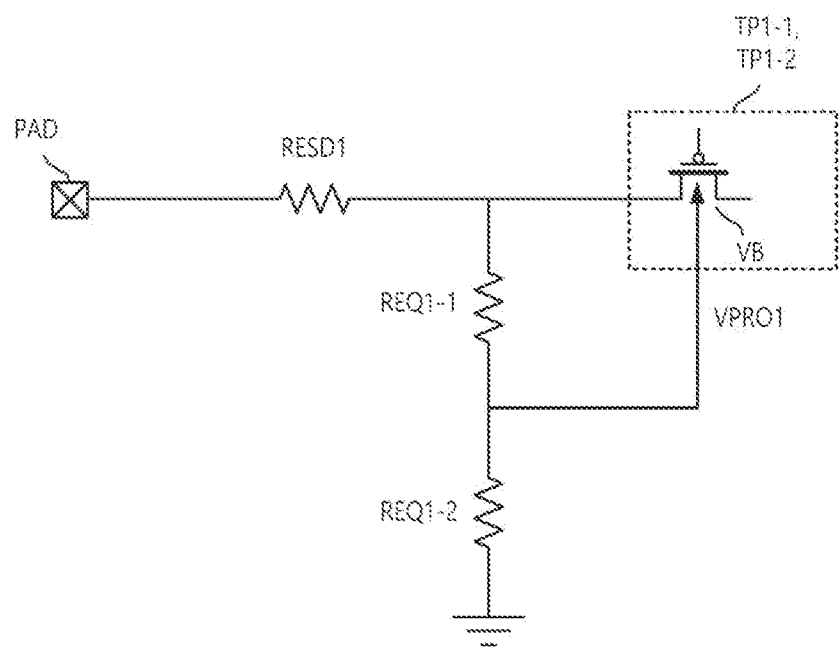

Accordingly, the first detector 1221 has an equivalent circuit as shown in FIG. 6B. In this case, REQ1-1 and REQ1-2 are equivalent resistors corresponding to the turned-on transistors. Accordingly, a voltage divided from the pad voltage VPAD may be applied to the transmitter 1110 as the first protection voltage VPRO1. In this case, because the first protection voltage VPRO1 is higher than or equal to the low power source voltage VDDL and lower than or equal to the power source voltage VDDH when the power source voltage VDDH is in an off state, according to an embodiment, the (4-1)-th NMOS transistor TN4-1 and the number of stacks of the (4-2)-th NMOS transistor TN4-2 to the (4-3)-th NMOS transistor TN4-3 may be changed. Accordingly, when the first protection voltage VPRO1 is applied as the body voltage VB of the (1-1)-th PMOS transistor TP1-1 and the (1-2)-th PMOS transistor TP1-2, the voltages between the nodes of the (1-1)-th PMOS transistor TP1-1 and the (1-2)-th PMOS transistor TP1-2 may be lower than or equal to the low power source voltage VDDL. That is, the voltage level of the first protection voltage may be adjusted according to the number of stacks of the (4-1)-th NMOS to the (4-3)-th NMOS.

Case in which Power Source Voltage VDDH is in on State

Figure 6C:
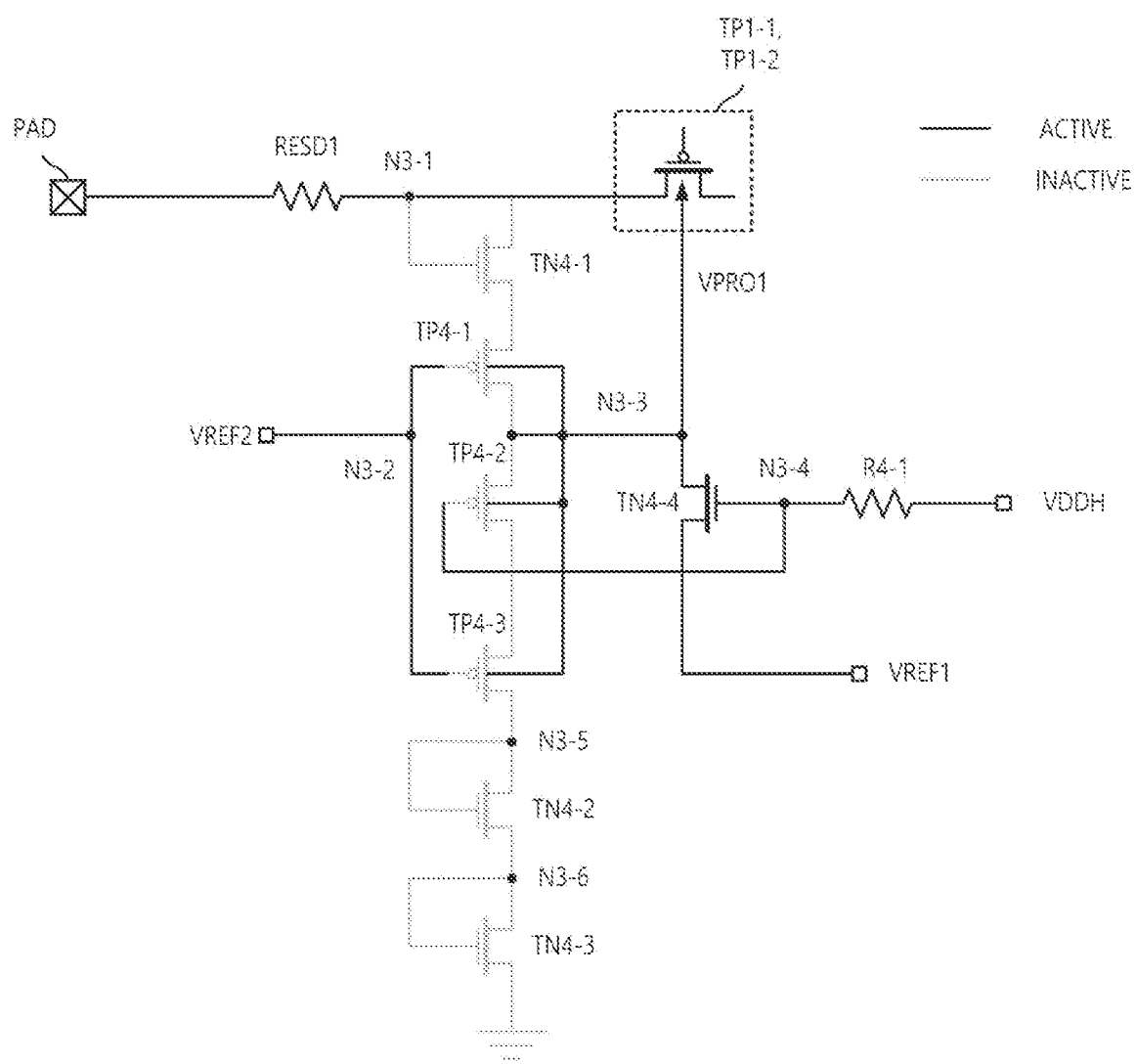

Referring to FIG. 6C, when the power source voltage VDDH is in an on state, the power source voltage VDDH is applied to the gate terminal of the (4-4)-th NMOS transistor TN4-4, and thus the (4-4)-th NMOS transistor TN4-4 is turned on. In addition, when the power source voltage VDDH is in an on state, as described above, the first reference voltage VREF1 becomes equal to the power source voltage VDDH, so that the gate and source voltages of the (4-2)-th PMOS transistor TP4-2 are the same, and the (4-2)-th PMOS transistor TP4-2 is turned off. Accordingly, the (4-1)-th PMOS transistor TP4-1, the (4-3)-th PMOS transistor TP4-3, and the (4-1)-th NMOS transistor TN4-1 to the (4-3)-th NMOS transistor TN4-3 are also turned off. In this case, the second reference voltage VREF2 lower than the low power source voltage VDDL is applied to the (4-1)-th PMOS transistor TP4-1 and the (4-3)-th PMOS transistor TP4-3 to prevent an overvoltage.

As the transistor is turned on/off, the first protection voltage VPRO1 is generated and applied to the transistor (e.g., the (1-1)-th PMOS transistor TP1-1 and the (1-2)-th PMOS transistor TP1-2) to which the pad voltage VPAD applied and which is included in the transmitter 1110.

Figure 6D:
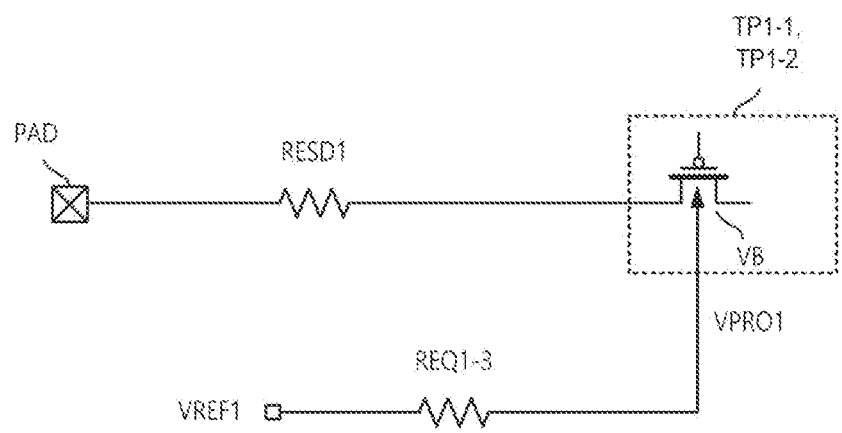

Accordingly, the first detector 1221 has an equivalent circuit as shown in FIG. 6D. In this case, REQ1-3 is an equivalent resistor corresponding to the (4-4)-th NMOS transistor TN4-4 turned on. Accordingly, the first reference voltage VREF1 or a voltage similar to the first reference voltage VREF1 may be applied to the transmitter 1110 as the first protection voltage VPRO1. In this case, when the power source voltage VDDH is in an on state, the first reference voltage VREF1 may be equal to the power source voltage VDDH. In this case, a voltage equal to or similar to the power source voltage VDDH may be the first protection voltage VPRO1. Accordingly, the voltages between the nodes of the (1-1)-th PMOS transistor TP1-1 and the (1-2)-th PMOS transistor TP1-2 may be less than or equal to the low power source voltage VDDL.

Figure 7:
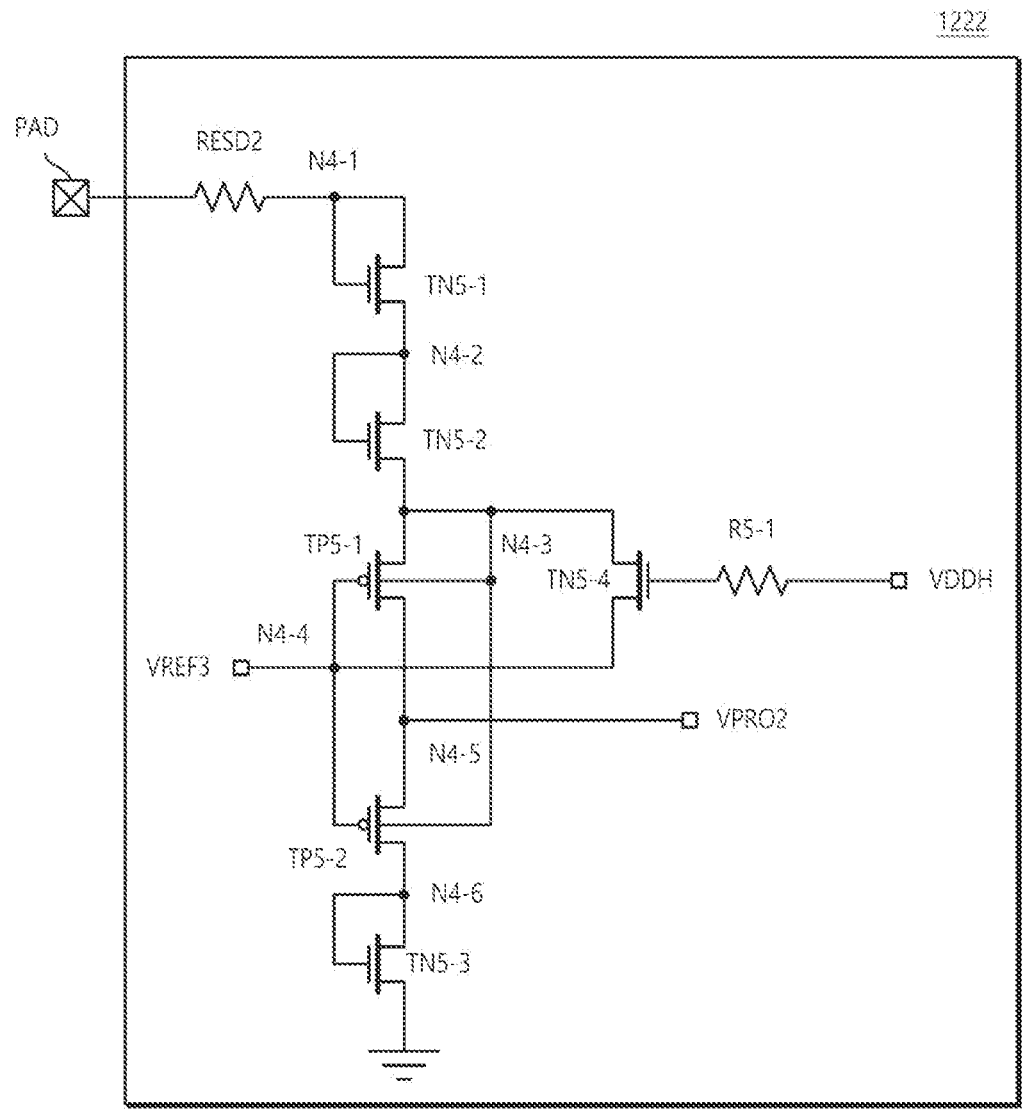
FIG. 7 is a circuit diagram illustrating a second detector according to an embodiment of the present disclosure.

FIG. 7 is a circuit diagram illustrating the second detector according to an embodiment of the present disclosure.

Referring to FIG. 7, a second detector 1222 according to an embodiment includes a second protection resistor RESD2, a (5-1)-th NMOS transistor TN5-1, a (5-2)-th NMOS transistor TN5-2, a (5-1)-th PMOS transistor TP5-1, a (5-2)-th PMOS transistor TP5-2, a (5-3)-th NMOS transistor TN5-3, a (5-4)-th NMOS transistor TN5-4, and a (5-1)-th resistor R5-1.

The second protection resistor RESD2 is connected to the pad PAD, to which the pad voltage VPAD is applied.

The gate terminal of the (5-1)-th NMOS transistor TN5-1 is connected to the second protection resistor RESD2. The gate terminal of the (5-2)-th NMOS transistor TN5-2 is connected to the (5-1)-th NMOS transistor TN5-1. The third reference voltage VREF3 is applied to the gate terminal of the (5-1)-th PMOS transistor TP5-1, and the source terminal is connected to the (5-2)-th NMOS transistor TN5-2. The third reference voltage VREF3 is applied to the gate terminal of the (5-2)-th PMOS transistor TP5-2, and the source terminal is connected to the (5-1)-th PMOS transistor TP5-1. The gate terminal of the (5-3)-th NMOS transistor TN5-3 is connected to the (5-2)-th PMOS transistor TP5-2. The power source voltage VDDH is applied to the gate terminal of the (5-4)-th NMOS transistor TN5-4, and the third reference voltage VREF3 is applied to the source terminal. In this case, the body terminal of the (5-1)-th PMOS transistor TP5-1 and the source terminal of the (5-2)-th PMOS transistor TP5-2 are connected to the receiver 1120.

More specifically, the (5-1)-th NMOS transistor TN5-1 is connected to the second protection resistor RESD2 through a (4-1)-th node N4-1. The gate terminal and one terminal of the (5-2)-th NMOS transistor TN5-2 are connected to the (5-1)-th NMOS transistor TN5-1 through a (4-2)-th node N4-2, and another terminal of the 5-2)-th NMOS transistor TN5-2 is connected to the (5-1)-th PMOS transistor TP5-1. A (4-3)-th node N4-3 is connected to the body of the (5-1)-th PMOS transistor TP5-1, the third reference voltage VREF3 is applied to the gate terminal through a (4-4)-th node N4-4, and the (5-2)-th PMOS transistor TP5-2 is connected to another terminal through a (4-5)-th node N4-5. The (5-3)-th NMOS transistor TN5-3 is connected to another terminal of the (5-2)-th PMOS transistor TP5-2 through a (4-6)-th node N4-6.

The power source voltage VDDH is applied to the gate terminal of the (5-4)-th NMOS transistor TN5-4 through the (5-1)-th resistor R5-1, the (4-3)-th node N4-3 is connected to one terminal of the (5-4)-th NMOS transistor TN5-4, and the third reference voltage VREF3 is applied to another terminal of the (5-4)-th NMOS transistor TN5-4.

Based on the turn on/off of at least one of the plurality of transistors included in the above-described second detector 1222, the second protection voltage VPRO2 is generated and applied through the (4-5)-th node N4-5.

FIGS. 8A to 8D are circuit diagrams illustrating the operation of the second voltage detector of FIG. 7.

Case in which Power Source Voltage VDDH is in Off State

Figure 8A:
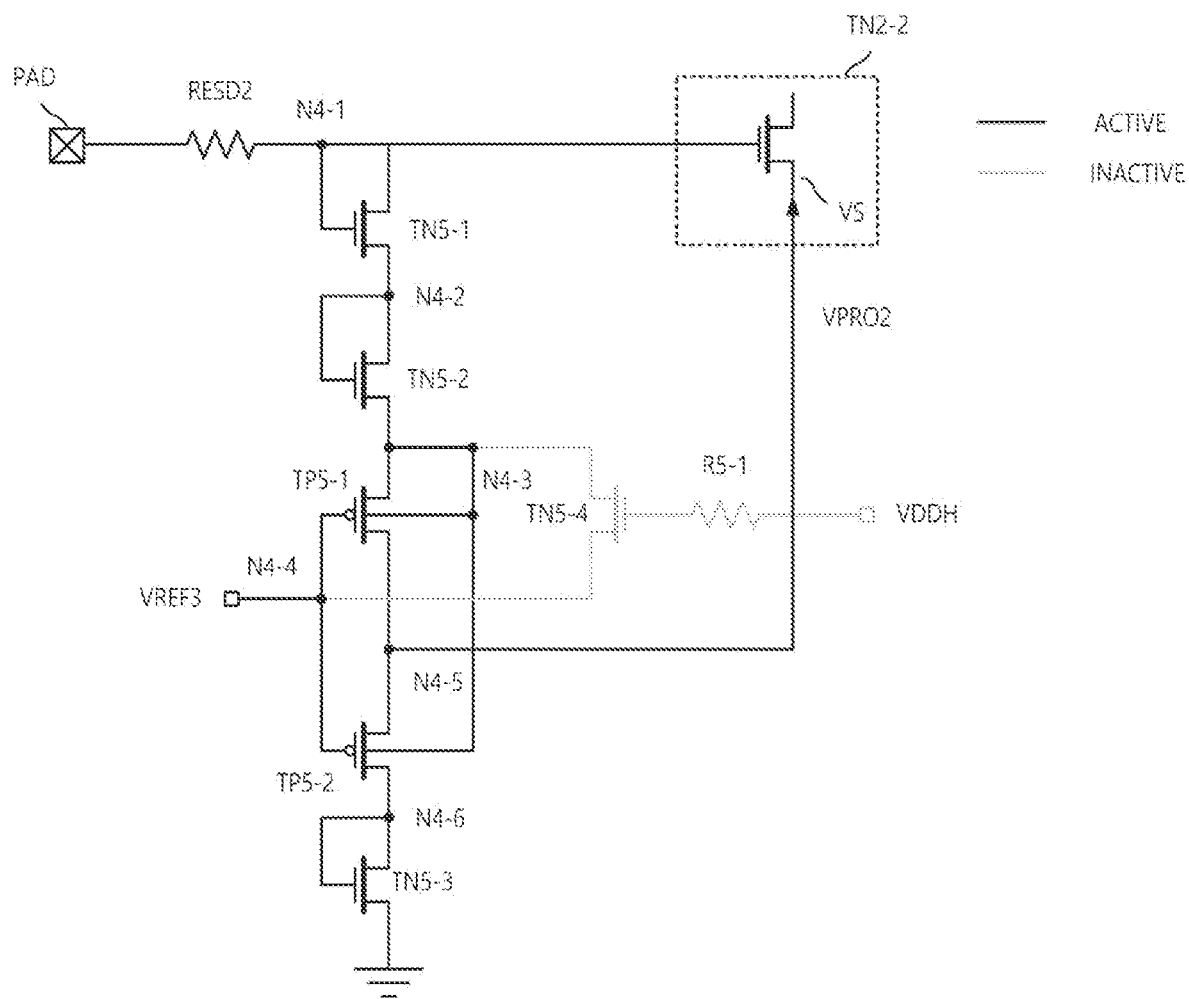
FIGS. 8A to 8D are circuit diagrams illustrating the operation of the second voltage detector of FIG. 7.

Referring to FIG. 8A, when the power source voltage VDDH is in an off state, the voltage of 0 V is applied to the gate terminal of the (5-4)-th NMOS transistor TN5-4, and thus the (5-4)-th NMOS transistor TN5-4 is turned off. In addition, when the power source voltage VDDH is in an off state, as described above, the third reference voltage VREF3 is also a voltage of 0 (zero) V. Accordingly, the (5-1)-th PMOS transistor TP5-1 and the (5-2)-th PMOS transistor TP5-2 are turned on. In addition, as the pad voltage VPAD is applied, the (5-1)-th NMOS transistor TN5-1 to the (5-3)-th NMOS transistor TN5-3 are turned on.

As the transistor is turned on/off, the second protection voltage VPRO2 having a voltage equal to or less than the difference between the pad voltage VPAD and the low power source voltage VDDL is generated, so that the number of stacks of the (5-1)-th NMOS transistor TN5-1 and the (5-2)-th NMOS transistor TN5-2 or the (5-3)-th NMOS transistor TN5-3 may be changed when necessary. The generated second protection voltage VPRO2 is applied to the transistor (e.g., the (2-2)-th NMOS transistor TN2-2) to which the pad voltage VPAD included in the receiver 1120 is applied. That is, the voltage level of the second protection voltage VPRO2 may be adjusted according to the number of stacks of the (5-1)-th NMOS transistor to the (5-3)-th NMOS transistor.

Figure 8B:
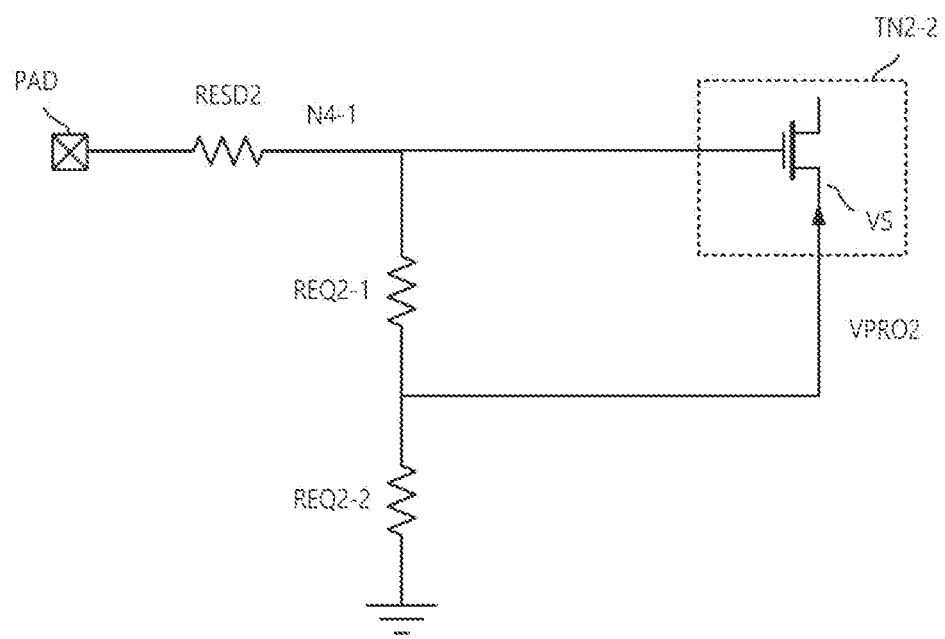

Accordingly, the second detector 1222 has an equivalent circuit as shown in FIG. 8B. In this case, REQ1-1 and REQ1-2 are equivalent resistors corresponding to the turned-on transistors. Accordingly, the voltage divided from the pad voltage VPAD may be applied to the receiver 1120 as the second protection voltage VPRO2. In this case, the second protection voltage VPRO2 may be less than or equal to the difference between the pad voltage VPAD and the low power source voltage VDDL when the power source voltage VDDH is in an off state. Therefore, the second protection voltage VPRO2, which is less than or equal to the low power source voltage VDDL, is applied as the source voltage VS of the (2-2)-th NMOS transistor TN2-2, and the voltage between the nodes of the (2-2)-th NMOS transistor TN2-2 may be less than or equal to the low power source voltage VDDL.

Case in which Power Source Voltage VDDH is in on State

Figure 8C:
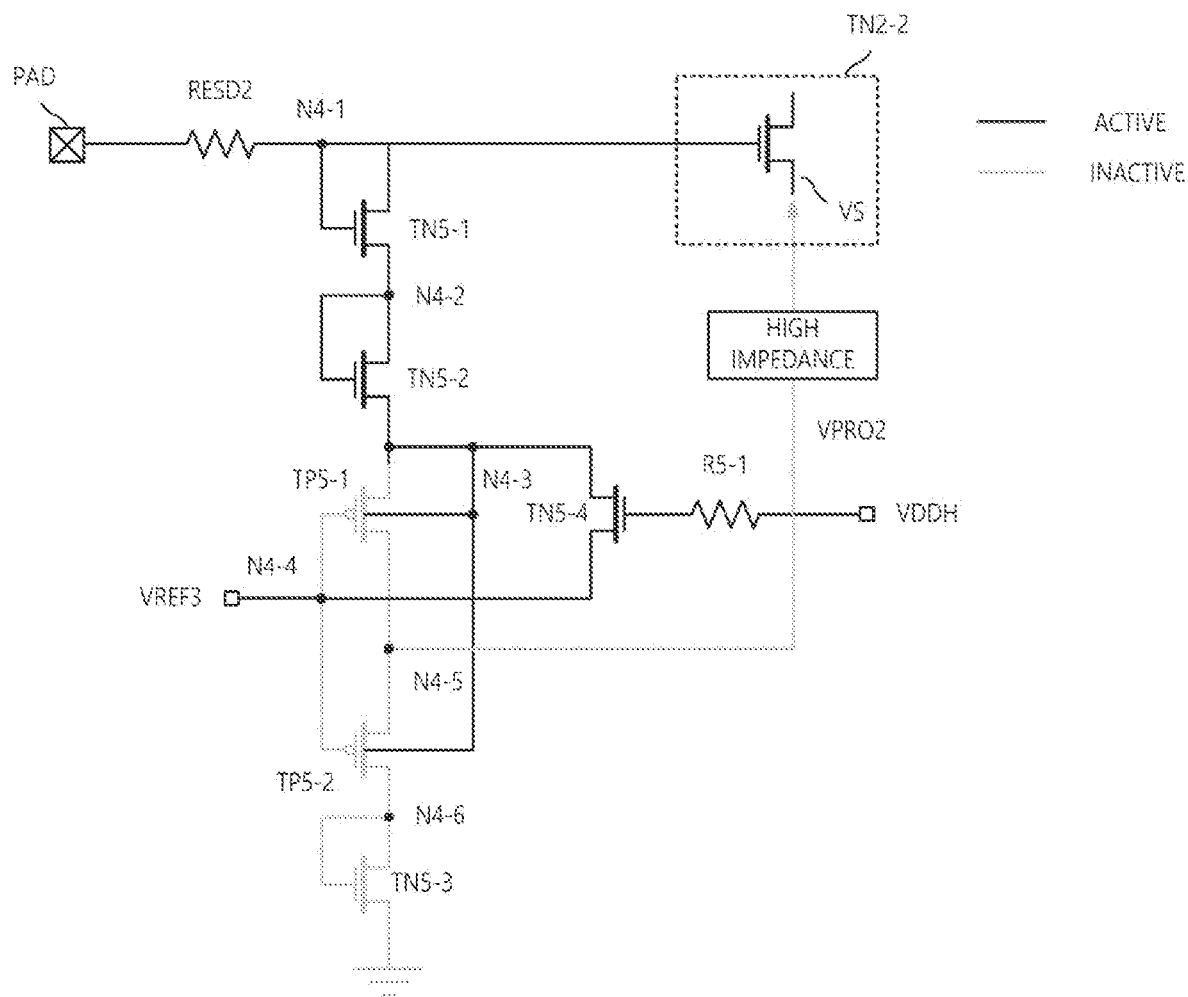

Referring to FIG. 8C, when the power source voltage VDDH is in an on state, the power source voltage VDDH is applied to the gate terminal of the (5-4)-th NMOS transistor TN5-4, and thus the (5-4)-th NMOS transistor TN5-4 is turned on. In addition, the (5-1)-th NMOS transistor TN5-1 and the (5-2)-th NMOS transistor TN5-2 are turned on due to the pad voltage VPAD. Further, when the power source voltage VDDH is in an on state, as described above, the third reference voltage VREF3 has a voltage value between the power source voltage VDDH and the low power source voltage VDDL. Therefore, the gate and source voltages of the (5-1)-th PMOS transistor TP5-1 become the same, so that the (5-1)-th PMOS transistor TP5-1 is turned off, and thus, the (5-2)-th PMOS transistor TP5-2 and the (5-3)-th NMOS transistor TN5-3 are turned off.

As the transistor is turned on/off, the second protection voltage VPRO2 is generated and applied to the transistor (e.g., the (2-2)-th NMOS transistor TN2-2) to which the pad voltage VPAD included in the receiver 1120 is applied.

Figure 8D:
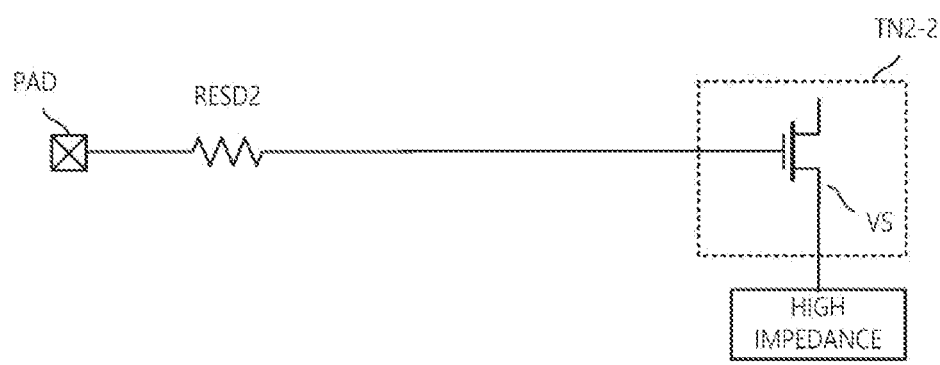

Accordingly, the second detector 1222 has an equivalent circuit as shown in FIG. 8D. As shown, because the source terminal of the transistor to which the pad voltage VPAD is applied is in a high-impedance state, the protection voltage is not applied. Therefore, the voltages between the nodes of the (2-2)-th NMOS transistor TN2-2 may be less than or equal to the low power source voltage VDDL.

Figure 9:
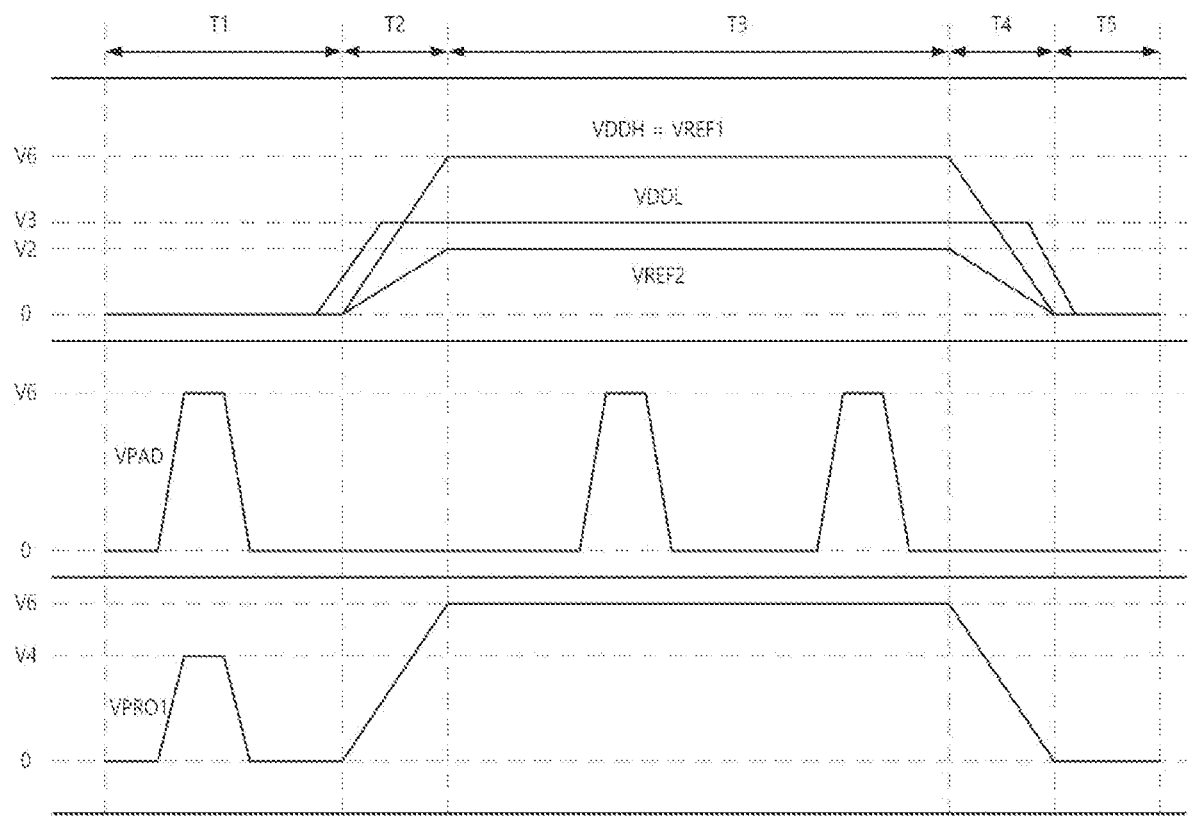
FIG. 9 is a waveform diagram illustrating an operation of a first detector according to an embodiment of the present disclosure.

FIG. 9 is a waveform diagram illustrating an operation of the first detector according to an embodiment of the present disclosure.

Referring to FIG. 9, time periods T1 to T5 sequentially correspond to power-off, power-on, operation mode, power-down, and power-off operations. When the power is turned on/off, the power source voltage VDDH and the low power source voltage VDDL are turned on/off.

First, in T1, it may be assumed that the pad voltage VPAD having a magnitude of V6 is applied. In this case, the power source voltage VDDH is still in an off state. Accordingly, the first protection voltage VPRO1 is generated when the power source voltage VDDH is in an off state. When the power source voltage VDDH is in an off state, because the reference voltage VREF is 0 (zero) V, the first protection voltage VPRO1 is generated to have a voltage V4 lower than V6 and higher than V3 based on the pad voltage VPAD.

In T2, the low power source voltage VDDL and the power source voltage VDDH start to be applied. In this case, as the power source voltage VDDH is turned on, the first reference voltage VREF1 and the second reference voltage VREF2 are generated. In addition, when the power source voltage VDDH is in an on state, the first protection voltage VPRO1 is generated according to the reference voltages VREF. Because the first protection voltage VPRO1 is generated based on the reference voltages VREF, the first protection voltage VPRO1 increases in the same manner as the reference voltage VREF. Then, when the low power source voltage VDDL reaches V3 and the power source voltage VDDH reaches V6, the first reference voltage VREF1 reaches V6, which is the same level as the power source voltage VDDH, and the second reference voltage VREF2 reaches V2 lower than V3, which is the low power source voltage VDDL. Similarly, the first protection voltage VPRO1 reaches V6, which is the same level as the power source voltage VDDH.

In operation mode T3, the pad voltage VPAD is applied according to the operation of the transceiver 1100. Nevertheless, the transmitter 1110 may still be protected through the first protection voltage VPRO1.

In T4 and T5, as the low power source voltage VDDL and the power source voltage VDDH decrease, the reference voltages VREF and the first protection voltage VPRO1 also decrease accordingly. Because the first protection voltage VPRO1 is applied in accordance with the reduced power source voltage VDDH, the transmitter 1110 may be protected.

Figure 10:
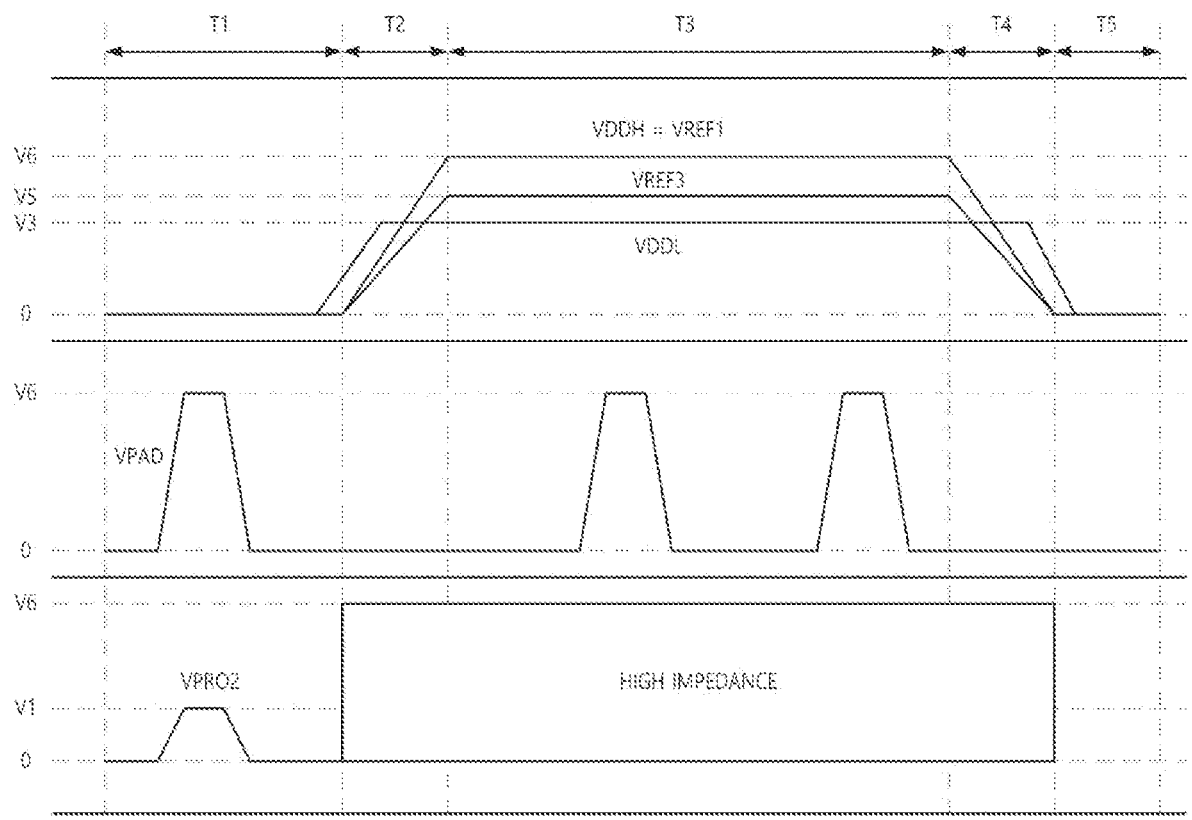
FIG. 10 is a waveform diagram illustrating an operation of a second detector according to an embodiment of the present disclosure.

FIG. 10 is a waveform diagram illustrating an operation of the second detector according to an embodiment of the present disclosure.

Referring to FIG. 10, likewise, it may be assumed that the pad voltage VPAD having a magnitude of V6 is applied in T1. In this case, the power source voltage VDDH is still in an off state. Accordingly, the second protection voltage VPRO2 is generated when the power source voltage VDDH is in an off state. When the power source voltage VDDH is in an off state, because the reference voltage VREF is 0 (zero) V, the second protection voltage VPRO2 is generated to have a level of V1 lower than V3 based on the pad voltage VPAD. Unlike the first detector 1221, the second protection voltage VPRO2 generated through the second detector 1222 has a lower level of V1 than the first protection voltage VPRO1 because the second protection voltage VPRO2 is applied to the source or drain terminal of the transistor.

In T2, the low power source voltage VDDL and the power source voltage VDDH start to be applied. In this case, as the power source voltage VDDH is turned on, the third reference voltage VREF3 is generated. As the third reference voltage VREF3 is generated, the source or drain terminal of the transistor of the receiver 1120 becomes set to a high impedance state. Referring to FIG. 7 as an example, the (5-1)-th PMOS transistor TP5-1 and the (5-2)-th PMOS transistor TP5-2 are turned off by the third reference voltage VREF3 to be in a high impedance state. The third reference voltage VREF3 may have a level of V5 between the power source voltage VDDH and the low power source voltage VDDL, which is to protect the node-to-node voltage of other transistors related to the third reference voltage VREF3 as well as the transistor to which the pad voltage VPAD is applied in the receiver 1120.

In operation mode T3, the pad voltage VPAD is applied according to the operation of the transceiver 1100. Nevertheless, because the source or drain terminal of the transistor is in a high impedance state, the receiver 1120 may be protected.

In T4 and T5, as the low power source voltage VDDL and the power source voltage VDDH decrease, the reference voltages also decreases accordingly.

As described above, when the power source voltage VDDH of the transceiver 1100 is turned on through the reference voltage generator 1210, the overvoltage protection circuit 1200 according to an embodiment of the present disclosure generates the reference voltage VREF for overvoltage protection of the transmitter 1110 and the receiver 1120. In addition, the voltage detector 1220 may generate a protection voltage for protecting the voltage between the nodes of the transistor to which the pad PAD is connected depending on whether the power source voltage VDDH is turned off or on, so that the reliability of the transistor in the transceiver 1100 is guaranteed. In particular, because the overvoltage protection circuit 1200 according to an embodiment of the present disclosure reduces the voltage between the nodes of the transistor to less than the low power source voltage VDDL, as well as a relatively thick gate transistor, a thin-gate transistor with a low limit voltage, like a single-gate (SG) structure, may also be protected.

Figure 11:
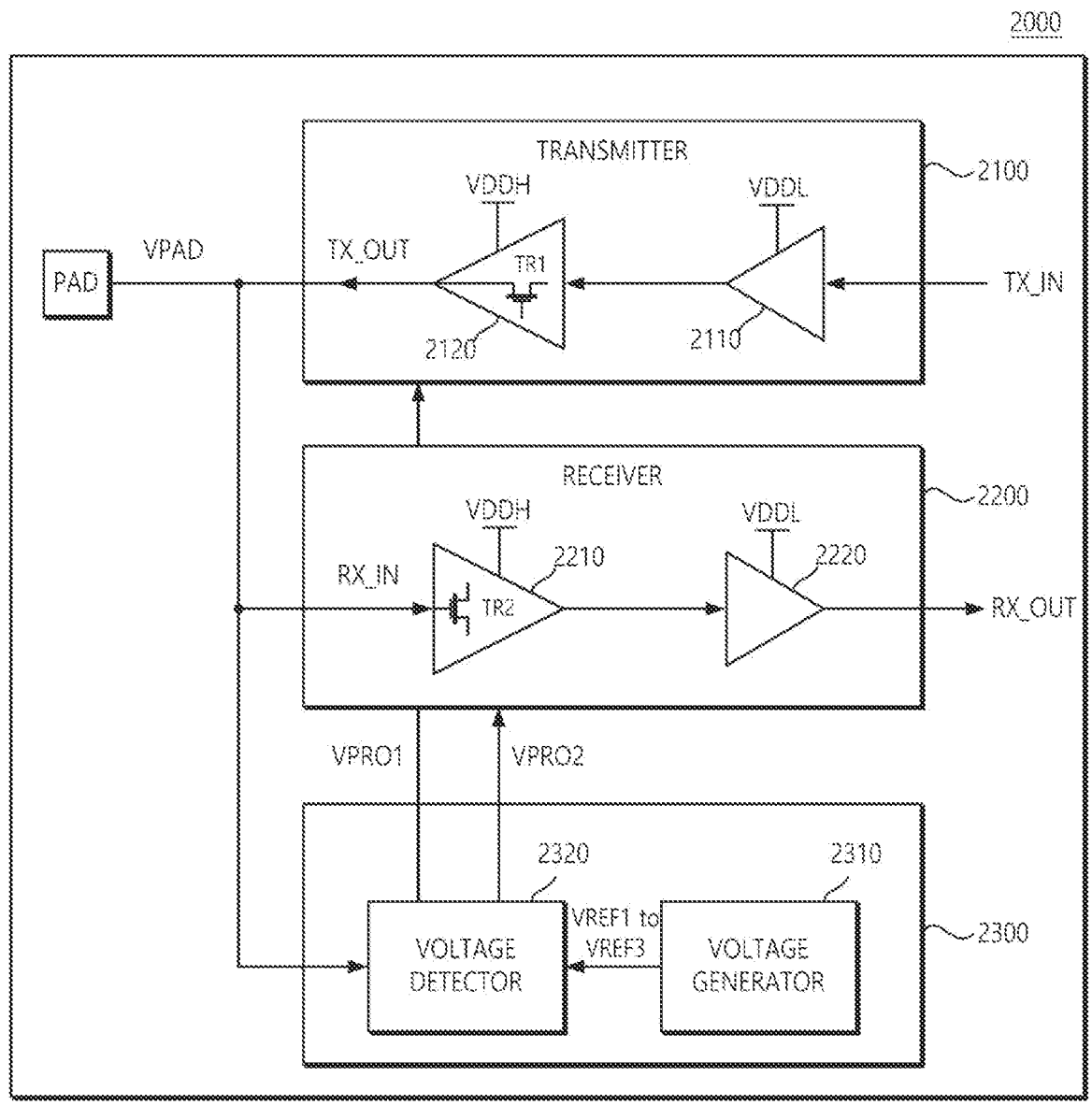
FIG. 11 is a diagram illustrating an electronic device according to an embodiment of the present disclosure.

FIG. 11 is a diagram illustrating an electronic device according to an embodiment of the present disclosure. Hereinafter, detailed descriptions of overlapping parts with the previous description will be omitted.

Referring to FIG. 11, an electronic device according to an embodiment includes a transmitter 2100, a receiver 2200, and an overvoltage protection circuit 2300. As shown, each of the transmitter 2100 and the receiver 2200 has a two-stage structure.

For example, the transmitter 2100 includes a first transmission terminal 2110 operating according to the low power source voltage VDDL and a second transmission terminal 2120 operating according to the power source voltage VDDH. When the transmission input signal TX_IN is applied to the first transmission terminal 2110, the amplified transmission output signal TX_OUT is generated by sequentially passing through the first transmission terminal 2110 and the second transmission terminal 2120. In this case, the second transmission terminal 2120 includes at least one first transistor TR1 to which the pad voltage VPAD is applied to the drain terminal.

For example, the receiver 2200 includes a first reception terminal 2210 operating according to the power source voltage VDDH and a second reception terminal 2220 operating according to the low power source voltage VDDL. When the reception input signal RX_IN is applied to the first reception terminal 2210, a reception output signal RX_OUT is generated by sequentially passing through the first reception terminal 2210 and the second reception terminal 2220. In this case, the first reception terminal 2210 includes at least one second transistor TR2 having a gate terminal to which the pad voltage VPAD is applied.

A reference voltage generator 2310 included in the overvoltage protection circuit 2300 generates the first reference voltage VREF1 to the third reference voltage VREF3. When the power source voltage VDDH is in an on state, a voltage detector 2320 generates the first protection voltage VPRO1 based on the first reference voltage VREF1 and the second reference voltage VREF2 and applies the first protection voltage VPRO1 to the transmitter 2100. In this case, the second protection voltage VPRO2 is not applied to the receiver 2200 due to the high impedance state. The voltage detector 2320 generates the first protection voltage VPRO1 and the second protection voltage VPRO2 based on the pad voltage VPAD when the power source voltage VDDH is in an off state.

According to an embodiment, the first protection voltage VPRO1 is applied to the body terminal of the at least one first transistor TR1, and the second protection voltage VPRO2 is applied to the source or drain terminal of the at least one second transistor TR2. Accordingly, even when at least one of the first transistor TR1 and the second transistor TR2 is a transistor having a thin gate, the voltage limit should not be exceeded.

Figure 12:
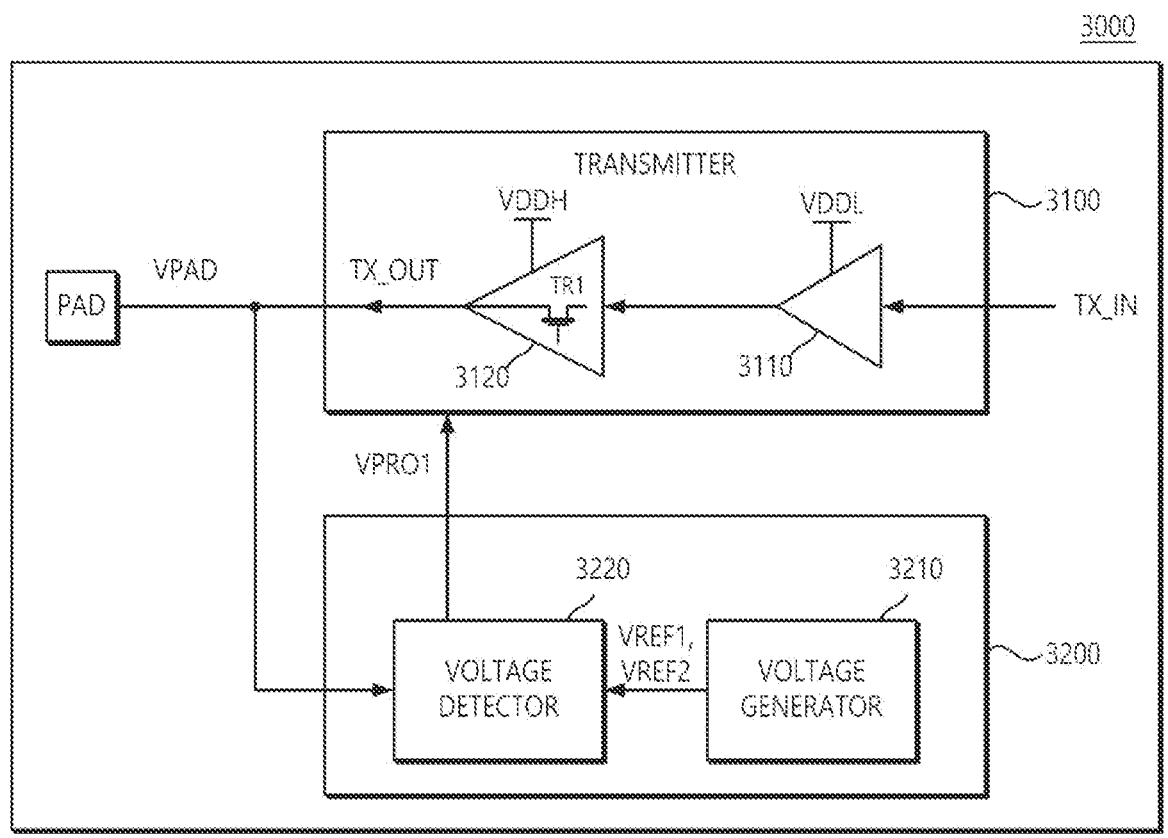
FIG. 12 is a diagram illustrating an electronic device according to an embodiment of the present disclosure.

FIG. 12 is a diagram illustrating an electronic device according to an embodiment of the present disclosure.

Referring to FIG. 12, an electronic device 3000 according to an embodiment includes a transmitter 3100 and an overvoltage protection circuit 3200 without including a separate receiver. As shown, the transmitter 3100 has a two-stage structure.

For example, the transmitter 3100 includes a first transmission terminal 3110 operating according to the low power source voltage VDDL and a second transmission terminal 3120 operating according to the power source voltage VDDH. When the transmission input signal TX_IN is applied to the first transmission terminal 3110, the amplified transmission output signal TX_OUT is generated by sequentially passing through the first transmission terminal 3110 and the second transmission terminal 3120. In this case, the second transmission terminal 3120 includes at least one first transistor TR1 to which the pad voltage VPAD is applied to the drain terminal.

A reference voltage generator 3210 included in the overvoltage protection circuit 3200 generates the first reference voltage VREF1 and the second reference voltage VREF2. When the power source voltage VDDH is in an on state, the voltage detector 3220 generates the first protection voltage VPRO1 based on the first reference voltage VREF1 and the second reference voltage VREF2 and applies the first protection voltage VPRO1 to the transmitter 3100. The voltage detector 3220 generates the first protection voltage VPRO1 based on the pad voltage VPAD when the power source voltage VDDH is in an off state. In this case, because the voltage detector 3220 only needs to generate the first protection voltage VPRO1 for the transmitter 3100, the voltage detector 3220 may include only the first detector described above or together with the second detector.

According to an embodiment, the first protection voltage VPRO1 may be applied to a body terminal of at least one first transistor TR1. Accordingly, the voltages between the nodes of at least one first transistor TR1 should not exceed the limit voltage.

Figure 13:
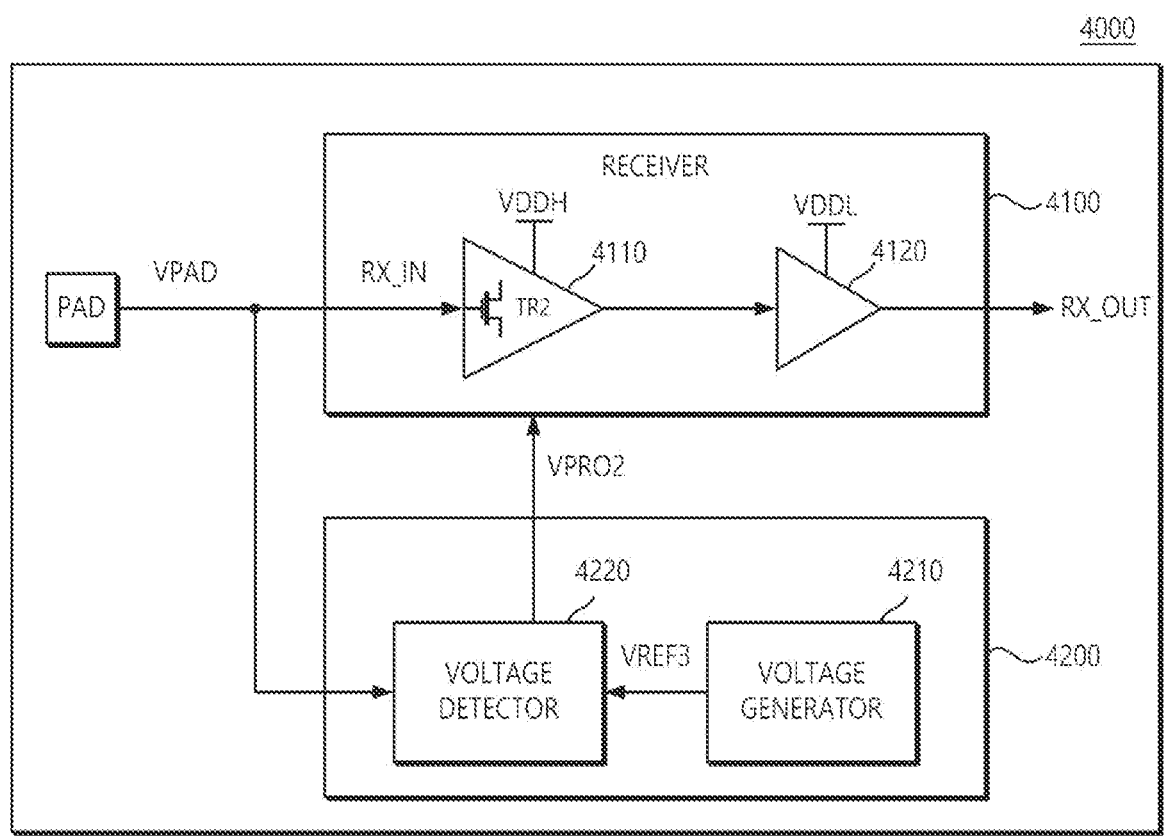
FIG. 13 is a diagram illustrating an electronic device according to an embodiment of the present disclosure.

FIG. 13 is a diagram illustrating an electronic device according to still another embodiment of the present disclosure.

Referring to FIG. 13, an electronic device 4000 according to an embodiment includes a receiver 4100 and an overvoltage protection circuit 4200 without including a separate transmitter.

For example, the receiver 4100 includes a first reception terminal 4110 operating according to the power source voltage VDDH and a second reception terminal 4120 operating according to the low power source voltage VDDL. When the reception input signal RX_IN is applied to the first reception terminal 4110, the reception output signal RX_OUT is generated by sequentially passing through the first reception terminal 4110 and the second reception terminal 4120. In this case, the first reception terminal 4110 includes at least one second transistor TR2 having a gate terminal to which the pad voltage VPAD is applied.

A reference voltage generator 4210 included in the overvoltage protection circuit 4200 generates the third reference voltage VREF3. When the power source voltage VDDH is in an on state, the second protection voltage VPRO2 is not applied to the receiver 4100 due to the high impedance state. A voltage detector 4210 generates the second protection voltage VPRO2 based on the pad voltage VPAD when the power source voltage VDDH is in an off state.

According to an embodiment, the second protection voltage VPRO2 may be applied to the source or drain terminal of the at least one second transistor TR2. Accordingly, the voltages between the nodes of at least one second transistor TR2 should not exceed the limit voltage.

Specific embodiments have been described above. The present disclosure may include not only the above-described embodiments, but also simple design changes or easily changeable embodiments. In addition, the present disclosure may include techniques that can easily modify and implement the embodiments. Therefore, the scope of the present disclosure should not be limited to the above-described embodiments.

What is claimed is:

1. An electronic device comprising:
   a transceiver including a transmitter and a receiver that operate based on a power source voltage and a pad voltage applied from a pad; and
   an overvoltage protection circuit configured to apply a first protection voltage to the transmitter and a second protection voltage to the receiver,
   wherein the overvoltage protection circuit comprises:
      a reference voltage generator configured to generate a reference voltage when the power source voltage is in an on state; and
      a voltage detector configured to set the first protection voltage and the second protection voltage based on the reference voltage when the power source voltage is in the on state, and set the first protection voltage and the second protection voltage based on the pad voltage when the power source voltage is in an off state.

2. The electronic device of claim 1, wherein the first protection voltage is a body voltage applied to a body terminal of a first transistor of the transmitter, and the second protection voltage is a source voltage applied to a source terminal of a second transistor of the receiver or a drain voltage applied to a drain terminal of the second transistor.

3. The electronic device of claim 1, wherein the transmitter comprises:
   a first transmission terminal configured to operate according to a low power source voltage that is relatively lower than the power source voltage; and
   a second transmission terminal including at least one p-channel metal-oxide semiconductor (PMOS) transistor that operates according to the power source voltage and has a source terminal or a drain terminal to which the pad voltage is applied,
   wherein the receiver comprises:
   a first reception terminal including at least one n-channel metal-oxide semiconductor (NMOS) transistor or PMOS transistor that operates according to the power source voltage and has a gate terminal to which the pad voltage is applied; and
   a second reception terminal configured to operate according to the low power source voltage.

4. The electronic device of claim 3, wherein the first protection voltage is applied to a body terminal of the at least one PMOS transistor, and
   wherein the second protection voltage is applied to a source terminal or a drain terminal of the at least one NMOS transistor or PMOS transistor.

5. The electronic device of claim 3, wherein a voltage between nodes of the at least one PMOS transistor and the at least one NMOS transistor is maintained at the low power source voltage or below.

6. The electronic device of claim 3, wherein the first protection voltage is greater than or equal to the low power source voltage and less than or equal to the power source voltage when the power source voltage is in the off state, and equal to the power source voltage when the power source voltage is in the on state.

7. The electronic device of claim 3, wherein the second protection voltage is equal to or less than a difference between the pad voltage and the low power source voltage when the power source voltage is in the off state, and is not applied to the at least one NMOS transistor or PMOS transistor when the power source voltage is in the on state.

8. The electronic device of claim 3, wherein the reference voltage includes a first reference voltage and a second reference voltage for generating the first protection voltage and a third reference voltage for generating the second protection voltage, and
   wherein the first reference voltage is equal to the power source voltage, the second reference voltage is lower than the low power source voltage, and the third reference voltage is between the power source voltage and the low power source voltage.

9. The electronic device of claim 8, wherein the voltage detector comprises:
   a first detector configured to generate the first protection voltage and apply the first protection voltage to the transmitter; and
   a second detector configured to generate the second protection voltage and apply the second protection voltage to the receiver.

10. The electronic device of claim 9, wherein the first detector comprises:
    a first protection resistor connected to the pad;
    a (1-1)-th NMOS transistor having a gate terminal connected to the first protection resistor;
    a (1-1)-th PMOS transistor having a gate terminal to which the second reference voltage is applied and a source terminal connected to the (1-1)-th NMOS transistor;
    a (1-2)-th PMOS transistor having a gate terminal to which the power source voltage is applied and a source terminal connected to the (1-1)-th PMOS transistor;
    a (1-3)-th PMOS transistor having a gate terminal to which the second reference voltage is applied and a source terminal connected to the (1-2)-th PMOS transistor;
    a (1-2)-th NMOS transistor having a gate terminal connected to the (1-3)-th PMOS transistor;
    a (1-3)-th NMOS transistor having a gate terminal connected to the (1-2)-th NMOS transistor; and
    a (1-4)-th NMOS transistor having a gate terminal to which the power source voltage is applied and a source terminal connected to the transmitter,
    wherein body terminals of the (1-1)-th PMOS transistor, the (1-2)-th PMOS transistor and the (1-3)-th PMOS transistor are connected to the transmitter, and a voltage level of the first protection voltage is adjusted according to the number of stacks of the (1-1)-th NMOS transistor to the (1-3)-th NMOS transistor.

11. The electronic device of claim 10, wherein, when the power source voltage is in the off state, the (1-4)-th NMOS transistor is turned off, and a voltage divided from the pad voltage is applied to the transmitter as the first protection voltage, and when the power source voltage is in the on state, the (1-4)-th NMOS transistor is turned on, and a voltage corresponding to the first reference voltage is applied to the transmitter as the first protection voltage.

12. The electronic device of claim 9, wherein the second detector comprises:

a second protection resistor connected to the pad;
a (2-1)-th NMOS transistor having a gate terminal connected to the second protection resistor;
a (2-2)-th NMOS transistor having a gate terminal connected to the (2-1)-th NMOS transistor;
a (2-1)-th PMOS transistor having a gate to which the third reference voltage is applied and a source terminal connected to the (2-2)-th NMOS transistor;
a (2-2)-th PMOS transistor having a gate to which the third reference voltage is applied and a source terminal connected to the (2-1)-th PMOS transistor;
a (2-3)-th NMOS transistor having a gate terminal connected to the (2-2)-th PMOS transistor; and
a (2-4)-th NMOS transistor having a gate to which the power source voltage is applied and a source terminal to which the third reference voltage is applied,
wherein a body terminal of the (2-1)-th PMOS transistor and the source terminal of the (2-2)-th PMOS transistor are connected to the receiver.

13. The electronic device of claim 12, wherein, when the power source voltage is in the off state, the (2-4)-th NMOS transistor is turned off, and a voltage divided from the pad voltage is applied to the receiver as the second protection voltage, and when the power source voltage is in the on state, the (2-4)-th NMOS transistor is turned on, and the body terminal of the (2-1)-th PMOS transistor and the source terminal of the (2-2)-th PMOS transistor have a high impedance.

14. The electronic device of claim 12, wherein a voltage level of the second protection voltage is adjusted according to the number of stacks of the (2-1)-th NMOS transistor to the (2-3)-th NMOS transistor.

* * * * *